United States Patent
Heyns et al.

(10) Patent No.: US 8,576,614 B2
(45) Date of Patent: Nov. 5, 2013

(54) TUNNEL TRANSISTOR, LOGICAL GATE INCLUDING THE TRANSISTOR, STATIC RANDOM-ACCESS MEMORY USING THE LOGICAL GATE AND METHOD FOR MAKING SUCH A TUNNEL TRANSISTOR

(75) Inventors: Marc Heyns, Leuven (BE); Cedric Huyghebaert, Leuven (BE); Anne S. Verhulst, Leuven (BE); Daniele Leonelli, Leuven (BE); Rita Rooyackers, Leuven (BE); Wim Dehaene, Leuven (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 0 days.

(21) Appl. No.: 13/587,733

(22) Filed: Aug. 16, 2012

(65) Prior Publication Data
US 2013/0064005 A1 Mar. 14, 2013

(30) Foreign Application Priority Data

Sep. 9, 2011 (EP) .................................. 11180814

(51) Int. Cl.
*G11C 11/00* (2006.01)
(52) U.S. Cl.
USPC ...... 365/154; 365/189.04; 257/365; 257/366; 257/E29.179; 438/283; 326/112
(58) Field of Classification Search
USPC ............. 365/154–156, 189.08; 257/365, 366, 257/E29.179; 438/283; 326/112–123
See application file for complete search history.

(56) References Cited

U.S. PATENT DOCUMENTS

| | | | |
|---|---|---|---|
| 5,021,841 A | 6/1991 | Leburton et al. | |
| 5,365,083 A | 11/1994 | Tada | |
| 6,563,185 B2* | 5/2003 | Moddel et al. | 257/425 |
| 7,732,282 B2* | 6/2010 | Le Royer et al. | 438/268 |
| 8,120,115 B2* | 2/2012 | Vandenberghe et al. | 257/365 |
| 8,369,134 B2* | 2/2013 | Singh et al. | 365/154 |
| 2003/0062560 A1 | 4/2003 | Fisher et al. | |
| 2005/0003612 A1 | 1/2005 | Hackler et al. | |
| 2008/0224224 A1 | 9/2008 | Vandenderghe et al. | |
| 2009/0101975 A1 | 4/2009 | Holz et al. | |
| 2010/0140589 A1* | 6/2010 | Ionescu | 257/24 |
| 2010/0171569 A1* | 7/2010 | Ionescu et al. | 333/185 |
| 2012/0223390 A1* | 9/2012 | Liang et al. | 257/369 |

OTHER PUBLICATIONS

Boucart et al. "Double-Gate Tunnel FET With High-κ Gate Dielectric" IEEE Transactions on Electron Devices, vol. 54, No. 7, Jul. 2007, 1725-1733.
Giraud et al. "In-depth Analysis of 4T SRAM Cells in Double-Gate CMOS" !IIEEE International Conference on Integrated Circuit Design and Technology, 2007, 1-4244-0757-5/07/$20.00 © 2007 IEEE.

(Continued)

*Primary Examiner* — Harry W Byrne
*Assistant Examiner* — Lance Reidlinger
(74) *Attorney, Agent, or Firm* — Knobbe Martens Olson & Bear LLP

(57) ABSTRACT

A tunnel transistor is provided including a drain, a source and at least a first gate for controlling current between the drain and the source, wherein the first sides of respectively the first and the second gate dielectric material are positioned substantially along and substantially contact respectively the first and the second semiconductor part.

19 Claims, 32 Drawing Sheets

(56) References Cited

OTHER PUBLICATIONS

Giraud et al., "A Comparative Study of 6T and 4T SRAM Cells in Double-Gate CMOS with Statistical Variation" ISCAS May 2007, New Orleans, USA, 1-4244-0921-7/07 $25.00 © 2007 IEEE.

Giraud et al., "A Novel 4T Asymmetric Single-Ended SRAM Cell in sub-32 nm Double Gate Technology" ISCAS, Seattle, May 2008, 978-1-4244-1684-4/08/$25.00 © 2008 IEEE.

He et al. "Numerical Simulation on Novel Nano-Scale Lateral Double-Gate Tunneling Field Effect Transistor" Nanoelectronics Conference (INEC), 2010 3rd International, Jan. 3-8, 2010, 978-1-4244-3544-9/10/$25.00 © 2010 IEEE.

Jang et al. "Ambipolarity characterization of tunneling field-effect transistors" Silicon Nanoelectronics Workshop (SNW), 2010, IEEE, Piscataway, NJ, USA, Jun. 13, 2010, pp. 1-2, XP031746360, ISBN: 978-1-4244-7727-2.

Nirschl et al., "Scaling properties of the tunneling field effect transistor (TFET): Device and circuit" Solid State Electronics 50 (2006) 44-51.

Saripalli et al., "Low Power Loadless 4T SRAM cell based on Degenerately Doped Source (DDS) In0.53Ga0.47As Tunnel FETs" *IEEE Device Research Conference Digest (DRC 2010)* pp. 103-104, South Bend, Indiana, Jun. 2010, 978-1-4244-7870-5/10/$26.00 © 2010 IEEE.

\* cited by examiner

TUNNEL TRANSISTOR, LOGICAL GATE INCLUDING THE TRANSISTOR, STATIC RANDOM-ACCESS MEMORY USING THE LOGICAL GATE AND METHOD FOR MAKING SUCH A TUNNEL TRANSISTOR

CROSS-REFERENCE TO RELATED APPLICATION

This application claims the benefit under 35 U.S.C. §119 (a)-(d) of European application No. 11180814.3, filed Sep. 9, 2011, the disclosure of which is hereby expressly incorporated by reference in its entirety and is hereby expressly made a portion of this application.

TECHNICAL FIELD

A tunnel transistor is provided. Also provided are a logical gate comprising the transistor and a static random-access memory using the logical gate.

BACKGROUND

Tunnel transistors are already known to the person skilled in the art. U.S. Pat. No. 5,365,083 for example describes a tunnel transistor. The tunnel transistor comprises a drain, a source and at least a first gate for controlling current between the drain and the source. The drain comprises a first semiconductor part which is doped with n-type dopants in electrical contact with a drain electrode. The source comprises a second semiconductor part which is doped with p-type dopants in electrical contact with a source electrode. The first gate comprises a first gate dielectric material adjacent to the first semiconductor part along and contacting the first semiconductor part with a first side of the first gate dielectric material at a first side of the tunnel transistor. The first gate also comprises a first gate electrode along the first gate dielectric and opposing the first side of the first gate dielectric material. The drain and the source are positioned adjacently to each other along a p-n junction of the tunnel transistor. The p-n junction extends longitudinally along an extending direction. The tunnel transistor comprises a second gate separate from the first gate. The second gate comprises a second gate dielectric material adjacent to the second semiconductor part along and contacting the second semiconductor part at a second side of the tunnel transistor with a first side of the second gate dielectric material. The second gate also comprises a second gate electrode along the second gate dielectric material and opposing the first side of the second gate dielectric material. The second side of the tunnel transistor opposes the first side of the tunnel transistor. The first and the second gate are provided to control current between a substantially conducting state and a substantially isolating state between the drain and the source by an electrical potential difference between the first and the second gate generating an electric field between the first and the second gate.

However, a substantial part of the first and the second gate electrodes are also positioned along respectively the second and the first semiconductor part. In such a configuration the electric field lines of the electric field generated are substantially parallel to the p-n junction and, although allowing a certain band bend, typically large electrical potential differences will be needed between the gate electrodes in order to deplete or create accumulation of carriers in the semiconductor region between the gates in order to create a band bending which is parallel to the gates, only allowing a limited use, especially for example in the field of logical gates. Without wanting to be bound by any theory, t this is believed to be because the p-n junction is creating a band bending orthogonal to the gates and this band bending has to be made negligible with respect to the gate-induced band bending.

U.S. Pat. Publ. No. 2009-0101975-A1 also describes a tunnel transistor. The tunnel transistor comprises a drain, a source and at least a first and a second gate for controlling current between the drain and the source. Although different gates are provided, the field lines of the electric field generated are either again substantially parallel to the extending direction and/or the first and second gate electrode are not positioned along respectively the first and the second semiconductor part but instead along a channel forming region which is intrinsically conducting or only weakly doped leading still to relatively large electrical potential differences between the gate electrodes.

U.S. Pat. No. 5,021,841 describes a tunnel transistor with a controlled negative differential resistance characteristic.

SUMMARY

A tunnel transistor which can be used with lower difference in voltages between the first and the second gate is desirable. Such a tunnel transistor is provided according to a first aspect.

In the tunnel transistor according to the first aspect, the first and second gate electrodes are positioned substantially along respectively the first and the second semiconductor part. In such a configuration for example substantially more than half, preferably at least 70%, more preferably at least 80% or even 90% or even substantially all, of the area of the first gate electrode is positioned along the first semiconductor part and more than half, preferably at least 70%, more preferably at least 80% or even 90% or even substantially all, of the area of the second gate electrode is positioned along the second semiconductor part.

It has been found that with such a configuration of the first and the second gate with respect to each other and with respect to the first and the second semiconductor part an electric field, induced by the electrical potential difference between the first and the second gate, can be created through the contact region such that the field lines are no longer substantially parallel to the contact region and instead cross the contact region such that the field lines of the electric field intersect with the extending direction, for example by grounding one of the gates and applying a different voltage to the other. Such a gate-induced electric field upon applying a different bias at both gates is substantially parallel to the electric field lines of the electric field when no gate electrodes would be present resulting from the doped semiconductor materials in contact with each other. It has been found that such a configuration allows for lower differences in electrical potential to be applied to the first and the second gate to control the current between the source and the drain.

According to certain embodiments of the first aspect, the second side of the tunnel transistor opposes the first side of the tunnel transistor as in such an embodiment the possible crossing of the field lines with the contact region, for example by grounding one of the gates and applying a different voltage to the other, is further improved.

According to certain embodiments of the first aspect, the first and the second semiconductor part are doped with dopants such that, upon application of a bias voltage in absence of an electrical potential difference between the first and the second gate, a tunneling current is obtained across the contact region between the base and the source. In such embodiments the Fermi energy level is situated near the valence band edge, for example in the valence band, of the second semiconductor part and near the conduction band edge, for example in the conduction band, of the first semiconductor part. In such case, an electrical potential difference can be applied over the first and the second gate allowing to substantially stop the tunneling current between the drain and the source switching the tunnel transistor, and more particularly the contact region, to an isolating state. When applying different electrical potential differences over the first and the second gate, the tunnel transistor and more in particular the contact region can be switched to a conducting state in which current is still sufficiently allowed between the drain and the source.

For example, the tunnel transistor, and more in particular the contact region, can be put into the isolating state upon application of a sufficient positive voltage at the second gate and lower voltage at the first gate. When defining the higher voltage as "1" and the lower voltage is defined as "0", the following table can be obtained:

| Voltage at second gate | Voltage at first gate | State of the transistor |
| --- | --- | --- |
| 0 | 0 | Conducting |
| 0 | 1 | Conducting |
| 1 | 0 | Isolating |
| 1 | 1 | Conducting |

According to certain embodiments of the first aspect, the first and the second semiconductor part are doped with dopants such that, upon application of a bias voltage, no substantial tunneling current is obtained across the contact region between the source and the drain. In such embodiments the Fermi energy level is situated near the valence band edge, preferably in the valence band, of the second semiconductor part and near the conduction band edge, for example between the conduction band and the valence band, of the first semiconductor part, in such a way that at least for one of the semiconductor parts, the Fermi level is located at the band edge or inside the forbidden gap. In such case, an electrical potential difference can be applied over the first and the second gate allowing a substantial tunneling current between the drain and the source switching the tunnel transistor, and more particularly the contact region, to a conducting state. When applying different electrical potential differences over the first and the second gate, the tunnel transistor and more in particular the contact region can be switched to an isolating state in which substantial current is no longer allowed between the drain and the source.

For example, the tunnel transistor, and more in particular the contact region, can be put into the conducting state upon application of a sufficient positive voltage at the first gate and lower voltage at the second gate. When defining the higher voltage as "1" and the lower voltage is defined as "0", the following table can be obtained:

| Voltage at first gate | Voltage at second gate | State of the transistor |
| --- | --- | --- |
| 0 | 0 | Isolating |
| 0 | 1 | Isolating |
| 1 | 0 | Conducting |
| 1 | 1 | Isolating |

In the context of the aspects and embodiments, the contact region forms a barrier in potential between the source and the drain through which no substantial current can flow, except for example by band-to-band tunneling, when applying a bias voltage across the source and the drain and is defined as a junction formed by the first and the second semiconductor part contacting each other or a further layer, applied between the first and the second semiconductor part, the further layer being a third semiconductor doped part separate from the first or the second semiconductor part or an insulating layer.

According to certain embodiments of the first aspect, the first and the second gate are positioned on opposing sides of the contact region and separated from each other by the extending direction over a separation distance along a direction perpendicular to the extending direction. By positioning the first and the second gate in such a configuration, the first and the second gate are positioned such that field lines of the electric field generated between the first and the second gate by the voltages applied by the first and the second gate intersect the extending direction of the contact region under an enlarged angle, improving the effect of the electric field on the current across the contact region.

According to certain embodiments of the first aspect, the first and the second semiconductor part contact each other along a junction forming the contact region.

According to certain embodiments of the first aspect, the contact region is a further layer applied between the first and second semiconductor part.

According to certain embodiments of the first aspect, the further layer is a third semiconductor doped part.

The third semiconductor part preferably is an intrinsic semiconductor or is doped with a doping ratio of less than $10^{18}$ atoms per cm$^3$, preferably less than $10^{17}$ atoms per cm$^3$.

According to certain embodiments of the first aspect, the further layer is an insulating layer, for example an oxide layer, a nitride layer or other very-wide bandgap material, for example silicon dioxide, silicon oxy nitride, aluminum oxide, high-k oxide, for example oxides, nitrided oxides, silicates and nitrided silicates of transition metals such as Hf, Ta, Ti, Nb, V, Y, Zr. Such insulating layers have been found to reduce p-n diffusion, for example drift-diffusion, leakage current, especially in transistors where small-bandgap materials are being used for the material being doped for the first and the second semiconductor part.

According to certain embodiments of the first aspect, the first sides of the first and the second gate dielectric material oppose each other along opposing sides of the contact region.

According to certain embodiments of the first aspect, the first sides of the first and the second gate dielectric material are substantially parallel with respect to the extending direction.

According to certain embodiments of the first aspect, the extending direction is substantially perpendicular to the first sides of the first and the second gate dielectric material.

According to certain embodiments of the first aspect, at least one of the gates envelopes its respective adjacent semiconductor part such that at least one pair of opposing sides of the respective semiconductor material is provided with the gate.

A logical gate forming a NAND gate with a first inverted input, comprising a first and a second tunnel transistor is provided in a second aspect.

Preferably, the first and the second tunnel transistor are transistors according to the first aspect. In such an embodiment, in the first transistor, the first and the second semiconductor part are doped with dopants such that, upon application of a bias voltage in absence of an electrical potential difference between the first and the second gate, already a tunneling current is obtained across the contact region. In the second transistor, the first and the second semiconductor part are doped with dopants such that, upon application of a bias voltage, no substantial tunneling current is obtained across the contact region. The first gate of the first tunnel transistor and the second gate of the second tunnel transistor are interconnected to the first inverted input of the logical gate such that a substantially identical voltage is electrical potential is applied to the first gate of the first tunnel transistor and the second gate of the second tunnel transistor. The second gate of the first tunnel transistor and the first gate of the second tunnel transistor are interconnected to the second input of the logical gate such that a substantially identical voltage is electrical potential is applied to the second gate of the first tunnel transistor and the first gate of the second tunnel transistor. The source of the first transistor and the drain of the second transistor are interconnected to the output of the logical gate, the drain of the first transistor being provided to be connected to a supply voltage $V_{dd}$ and the source of the second transistor is being provided to be connected to the ground.

It has been found that such a configuration of the first and the second tunnel transistor allows a truth table, as shown in the table below:

| Second input | First input | First transistor | Second transistor | Output |
|---|---|---|---|---|
| 0 | 0 | Conductive | Isolating | 1 |
| 0 | 1 | Conductive | Isolating | 1 |
| 1 | 0 | Isolating | Conductive | 0 |
| 1 | 1 | Conductive | Isolating | 1 |

Such a truth table indeed corresponds to a logical NAND gate having one of its inputs inverted, in this case being the first input. The logical NAND gate of the second aspect only needs two transistors, instead of more than two transistors, for example four transistors, as is required by the NAND gates described in the prior art. As the logical gate according to the second aspect requires fewer transistors for a similar functionality, the logical gate according to the second aspect takes up less space than the logical gates according to the prior art and therefore allows more logical gates to fit in a given amount of space, such as for example a chip.

In a third aspect, a static random-access memory (SRAM) comprising two logical gates according to the second aspect are provided. As in such SRAM only four transistors are needed, less space is needed for SRAM and more SRAM can be put on a given amount of space. Moreover, as less transistors are required for SRAM, the SRAM produces a reduced amount of heat while maintaining the same memory capacity or has an increased amount of memory for a given power consumption.

According to certain aspects of the static random-access memory of the third aspect, the second inputs and the outputs of the logical gates are interconnected. A latch or flip-flop formed in this way has been found to be ratioless. Due to the fact that ratioless latches are used, there is a significantly reduced sensitivity of the memory component to technological variability (variability examples: variability in threshold voltage Vt, in line edge roughness (LER), etc.)

In a fourth aspect, a method for making the tunnel transistor according to the first aspect is provided.

BRIEF DESCRIPTION OF THE DRAWINGS

The disclosure will be further elucidated by means of the following description and the appended figures.

Figure 1:
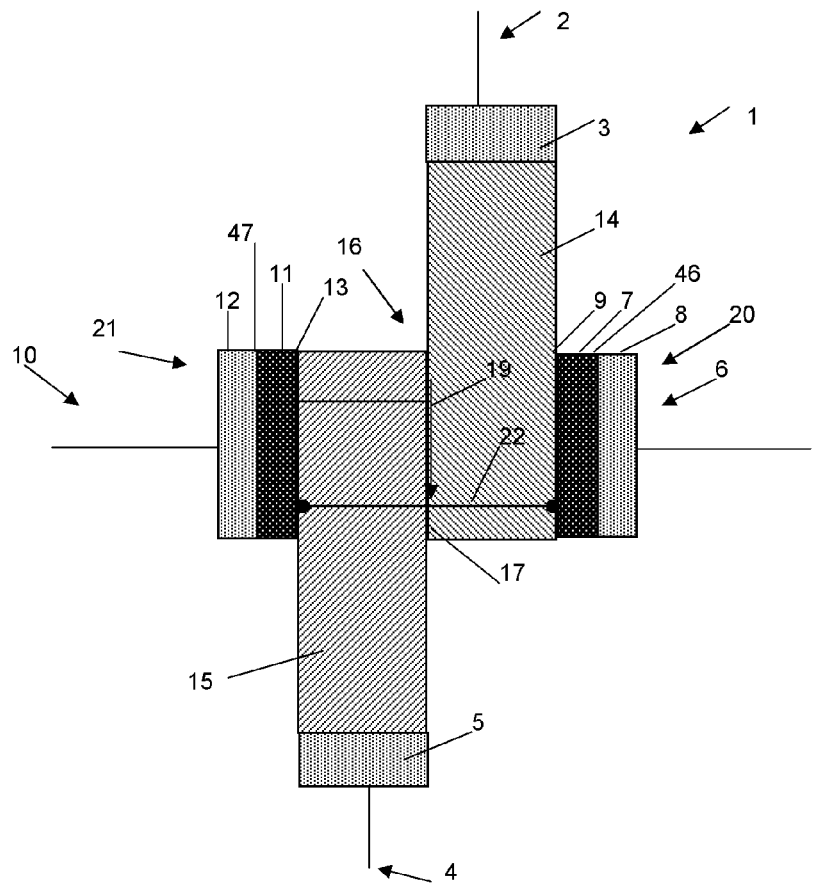
FIG. 1 shows a top view of an embodiment of a tunnel transistor.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present invention. While the present disclosure will be described with respect to particular embodiments and with reference to certain drawings, the disclosure is not limited hereto. The drawings included and described herein are schematic and are not limiting the scope of the invention. It is also noted that in the drawings, the size of some elements may be exaggerated and, therefore, not drawn to scale for illustrative purposes.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

1. Tunnel transistor
2. Drain
3. Drain electrode
4. Source
5. Source electrode
6. First gate
7. First gate dielectric material
8. First gate electrode
9. First side first gate dielectric material
10. Second gate
11. Second gate dielectric material 12. Second gate electrode
13. First side second gate dielectric material
14. First semiconductor part
15. Second semiconductor part
16. Contact region
17. Junction
18. Further layer
19. Extending direction
20. First side tunnel transistor
21. Second side tunnel transistor
22. Separation distance
23. Logical gate
24. First tunnel transistor of logical gate
25. Second tunnel transistor of logical gate
26. First inverted input
27. Second input
28. First gate first transistor
29. Second gate first transistor
30. Source first transistor
31. Drain first transistor
32. First gate second transistor
33. Second gate second transistor
34. Source second transistor
35. Drain second transistor
36. Output
37. SRAM
38. First logical gate
39. Second logical gate
40. First input first logical gate
41. Second input first logical gate
42. Output first logical gate
43. First input second logical gate
44. Second input second logical gate
45. Output second logical gate
46. Second side first gate dielectric material
47. Second side second gate dielectric material
48. Conduction band
49. Valence band
50. Fermi level holes
51. Fermi level electrons
52. Fin
53. Hard mask
54. Upper face fin
55. Oxide
56. Opening
57. First doped semiconductor material
58. Second doped semiconductor material
59. Resist
60. Exposed part
61. Covered part
62. Gate dielectric material
63. Gate electrode
64. First part
65. Second part
66. Second fin FIG. 1 shows an embodiment of a tunnel transistor.

The tunnel transistor 1 shown in FIG. 1 comprises a drain 2. The drain comprises a first semiconductor part 14 which is doped with n-type dopants. For example the material being doped of the first semiconductor part 14 is for example silicon, germanium, gallium arsenide (GaAs), indium arsenide (InAs), carbon nanotube (CNT), at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof, or carbon nanotubes, etc.

Preferably the first semiconductor material is silicon as most of the existing CMOS transistors today are made of silicon and a lot of re-use of the silicon expertise is possible. The n-type dopants, for example of a group IV semiconductor, can for example be any one of: Li, Sb, P, As, Bi, Te, Ti, C, Mg, Se, Cr, Ta, Cs, Ba, S, Mn, Ag, Cd, and/or Pt. Preferably the concentration of the n-type dopants are chosen such that $10^{21}$ atoms per $cm^3 \geq$ concentration of the n-type dopants $\geq 10^{18}$ atoms per $cm^3$, more preferably $2 \times 10^{20}$ atoms per $cm^3 \geq$ concentration of the n-type dopants $\geq 10^{19}$ atoms per $cm^3$. The dopants can be applied homogeneously, e.g., constant doping, or in a graded doping profile. The first semiconductor part 14 is in electrical contact with a drain electrode 3.

The tunnel transistor 1 further comprises a source 4. The source 4 comprises a second semiconductor part 15 which is doped with p-type dopants.

According to a first embodiment, the material of the first and the second semiconductor part 14, 15 being doped are the same. However, this is optional and the material being doped of the second semiconductor part 15 can also differ from the material being doped of the first semiconductor part 14. For example, a heterostructure with InAs for the first semiconductor part 14 and GaSb for the second semiconductor part 15, a Ge—Si or InAs—Si heterostructure or any other III-V or IV based heterostructure.

The p-type dopants, for example for a group IV semiconductor, can for example be any one of: B, Al, Ga, In, Tl, Pd, Na, Be, Zn, Au, Co, V, Ni, MO, Hg, Sr, Ge, Cu, K, Sn, W, Pb, O, and/or Fe. Preferably the concentration of the p-type dopants are chosen such that $10^{21}$ atoms per $cm^3 \geq$ concentration of the p-type dopants $\geq 10^{18}$ atoms per $cm^3$, more preferably $2 \times 10^{20}$ atoms per $cm^3 \geq$ concentration of the p-type dopants $\geq 10^{19}$ atoms per $cm^3$. The dopants can be applied homogeneously, i.e. constant doping, or in a graded doping profile. The second semiconductor part 15 is in electrical contact with a source electrode 5.

The first and the second semiconductor part 14, 15 shown in FIG. 1 are longitudinal and more specifically have a rectangular shape. This is, however, optional and the first and the second semiconductor part 14, 15 can also have a different shape such as for example triangular, parallelloid, triangular, etc. deemed appropriate by the person skilled in the art.

The tunnel transistor 1 further comprises a first gate 6 and a second gate 10 for controlling current between the drain 2 and the source 4.

The first gate 6 comprises a first gate dielectric material 7 adjacent to the first semiconductor part 14 along and contacting, with a first side 9 of the first gate dielectric material 7, the first semiconductor part 14 at a first side 20 of the tunnel transistor 1. The first gate dielectric material 7 can be any material deemed appropriate by the person skilled in the art but preferably is one of: an oxide layer, a nitride layer or other very-wide bandgap material, for example silicon dioxide, silicon oxy nitride, aluminum oxide, high-k oxide, for example oxides, nitrided oxides, silicates and nitrided silicates of transition metals such as Hf, Ta, Ti, Nb, V, Y, and/or Zr.

A first gate electrode 8 is positioned along the first gate dielectric material 7. The first gate electrode 8 is positioned such that it opposes the first side 9 of the first gate dielectric material 7 along the second side 46 of the first gate dielectric material 7. The first gate electrode 8 can be made of a conductive material and is for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE). The gate electrode 8 material is chosen such that a particular gate workfunction is obtained.

The tunnel transistor 1 further comprises a second gate 10 separate from the first gate 6. The second gate 10 comprises a second gate dielectric material 11 adjacent to the second semiconductor part 15 along and contacting, with a first side 13 of the second gate dielectric material 12, the second semiconductor part 15 at a second side 21 of the tunnel transistor 1. The second gate dielectric material 11 can be any material deemed appropriate by the person skilled in the art but preferably is one of: an oxide layer, a nitride layer or other very-wide bandgap material, for example silicon dioxide, silicon oxy nitride, aluminum oxide, high-k oxide, for example oxides, nitrided oxides, silicates and nitrided silicates of transition metals such as Hf, Ta, Ti, Nb, V, Y, Zr. A second gate electrode 12 is positioned along the second gate dielectric material 11 and opposes the first side 13 of the second gate dielectric material 11 along the second side 47 of the second gate dielectric material 11. The second gate electrode 12 can be made of a conductive material and is for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE). The gate electrode 12 material is chosen such that a particular gate workfunction is obtained.

FIG. 1 shows that the drain 2 and the source 4 are positioned adjacently to each other along a contact region 16 of the tunnel transistor 1. The contact region 16 extends longitudinally along an extending direction 19. The contact region 16 preferably is in the form of an interface, having a limited thickness.

In FIG. 1 it is shown that the first sides 9, 13 of the first and the second gate dielectric material 7, 11 oppose each other along opposing sides of the contact region 16. Thereto, the longitudinally extending first and second semiconductor part 14, 15 are positioned with part of one of their respective longitudinally extending sides adjacent to each other such that the extending direction 19 extends along the longitudinal direction defined by the first and the second semiconductor part 14, 15.

Figure 8:
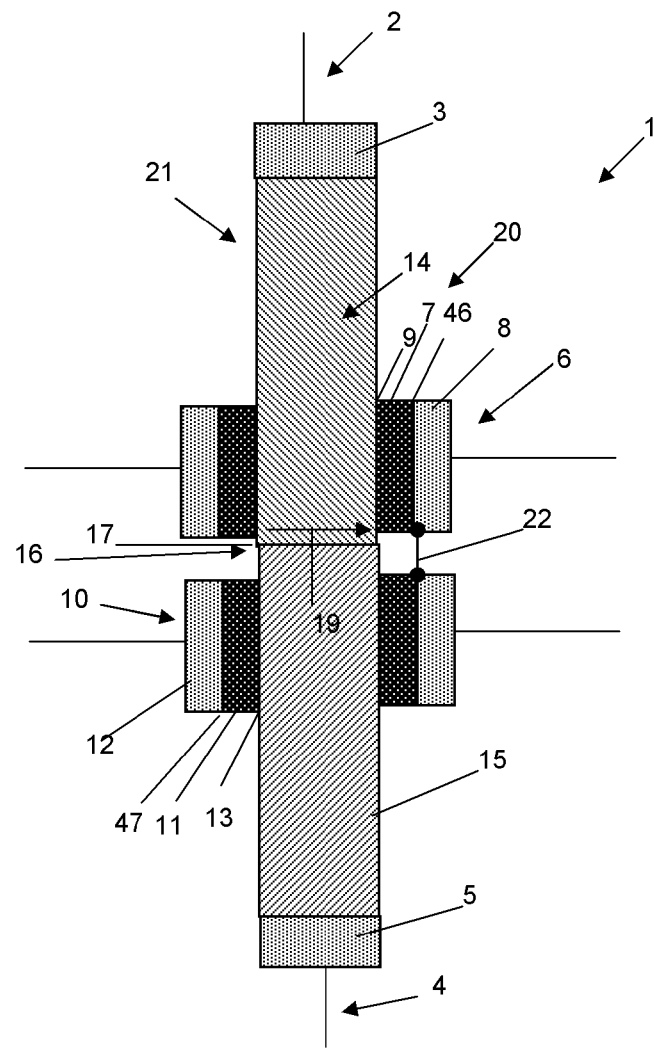
FIG. 8 shows a top view of a cross-section of a different embodiment of the tunnel transistor according to FIGS. 1 and 7.

Such a configuration is, however, optional. FIG. 8 for example shows a different embodiment of the tunnel transistor 1 according to the disclosure wherein the longitudinally extending first and second semiconductor part 14, 15 are positioned substantially in line. In such a configuration the extending direction 19 intersects the longitudinal direction defined by the first and the second semiconductor part 14, 15. In FIG. 8, more in particular, the extending direction 19 is substantially perpendicular to the longitudinal direction defined by the first and the second semiconductor part 14, 15.

In FIG. 1 and FIG. 8 it is shown that the first and the second semiconductor part 14, 15 contact each other along a junction 17 forming the contact region 16.

Figure 7:
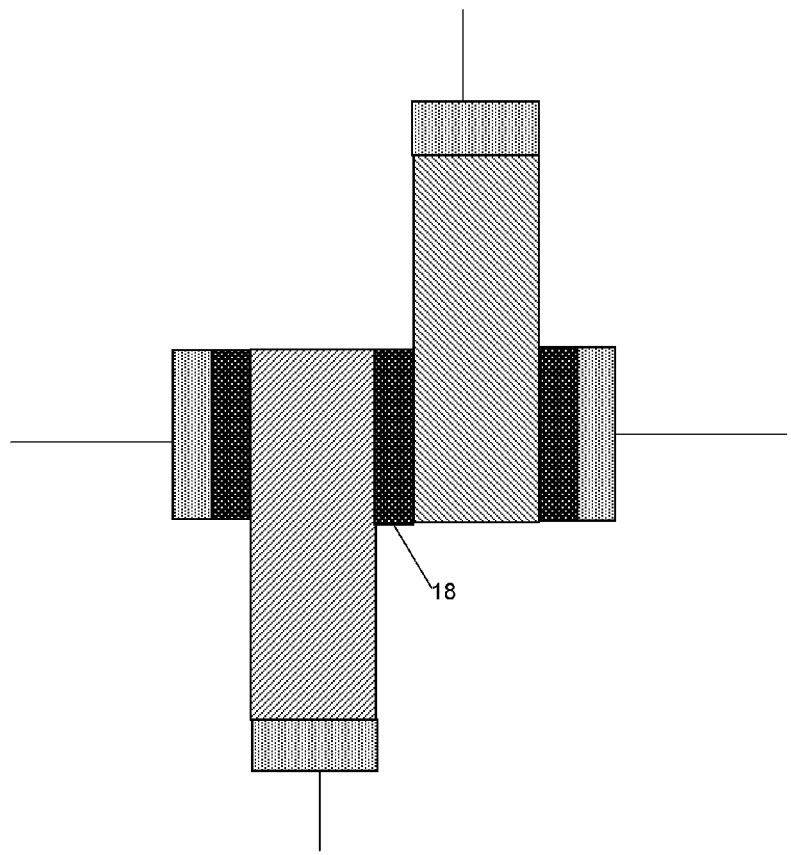
FIG. 7 shows a top view of a different embodiment of the tunnel transistor according to FIG. 1.
Figure 9:
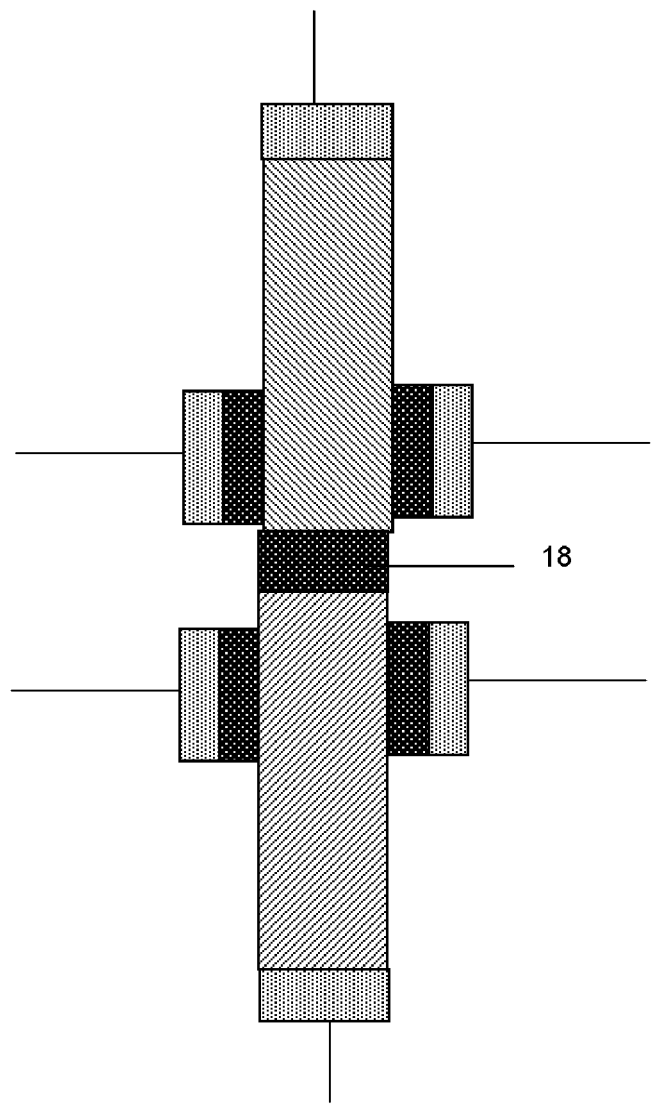
FIG. 9 shows a top view of a cross-section of a different embodiment of the tunnel transistor according to FIG. 8.

This is, however, optional and, as shown in FIGS. 7 and 9 the contact region 16 can also be a further layer 18 applied between the first and the second semiconductor part 14, 15. The remainder of the FIGS. 7 and 9 are substantially identical from FIGS. 1 and 8 respectively.

The further layer 18 can be a third semiconductor doped part in the form of, for example an intrinsic semiconductor or a semiconductor doped with a doping ratio of less than $10^{18}$ atoms per $cm^3$, preferably less than $10^{17}$ atoms per $cm^3$.

The further layer 18 can also be an insulating layer, like oxide, nitride or other very-wide bandgap material, for example silicon dioxide, silicon oxy nitride, aluminum oxide, high-k oxide, for example oxides, nitrided oxides, silicates and nitrided silicates of transition metals such as Hf, Ta, Ti, Nb, V, Y, and/or Zr.

The further layer 18 preferably has a thickness measured along a direction perpendicular to the extending direction 19 of the contact region 16 of 10 nm or less, preferably less than 5 nm. In case the further layer 18 is an insulating layer, the thickness is preferably even less than 2 nm.

The first 20 and the second 21 side of the tunnel transistor 1 according to the disclosure oppose each other. According to the figures, the first side 20 of the tunnel transistor 1 can be formed by a first, preferably longitudinally, extending side of the first semiconductor part 14 and the second side 21 of the tunnel transistor 1 is formed by a first, preferably longitudinally, extending side of the second semiconductor part 15. According to the embodiment of FIGS. 1 and 7 the second sides of the first and the second semiconductor parts 14, 15 opposing the respective first sides of the first and the second semiconductor parts 14, 15 are positioned along the contact region 16. According to the embodiment shown in FIGS. 8 and 9 this is however, optional, and the second sides of the first and the second semiconductor parts 14, 15 opposing the respective first sides of the first and the second semiconductor parts 14, 15 can also be positioned on opposing sides of the tunnel transistor 1 such that the first side 20 of the tunnel transistor 1 is formed by the first side of the first semiconductor part 14 and the second side of the second semiconductor part 15 whereas the second side 21 of the tunnel transistor 1 is formed by the second side of the first semiconductor part 14 and the first side of the second semiconductor part 15.

The first 6 and the second 10 gate are provided to control current between a substantially conducting state and a substantially isolating state between the drain 2 and the source 4 by an electrical potential difference between the first and the second gate 6, 10 generating a gate-induced electric field between the first and the second gate 6, 10.

Preferably, at least one, and for example both, of the first and the second semiconductor material 14, 15 is degenerately doped near the contact region 16.

The first and second gate electrode 8, 12 are positioned substantially along respectively the first and the second semiconductor part 14, 15.

The first sides 9, 13 of respectively the first and the second gate dielectric material 7, 11 are preferably positioned substantially along and substantially contact respectively the first and the second semiconductor part 14, 15. In such a configuration for example substantially more than half, preferably at least 70%, more preferably at least 80% or even 90% or even substantially all, of the area of the first side 9 is positioned along and contact the first semiconductor part 14 and more than half, preferably at least 70%, more preferably at least 80% or even 90% or even substantially all, of the area of the first side 13 is positioned along and contact the second semiconductor part 15. Preferably, an electrical field can be induced by the electrical potential difference between the first and the second gate 6, 10 such that field lines of the gate-induced electric field intersect with the extending direction 19, for example by grounding one of the gates 6, 10 and applying a different voltage to the other.

In FIGS. 1 and 7, the first sides 9, 13 of the first and the second gate dielectric material 7, 11 oppose each other along opposing sides of the contact region 16. As can be seen in FIGS. 1 and 7, in such a configuration the first and the second semiconductor part 14, 15 are positioned in between the first and the second gate 6, 10. Preferably, in such a configuration, the first sides of the first and the second gate dielectric material 7, 11 are substantially parallel with respect to the extending direction 19, as shown in FIGS. 1 and 7. This is, however, optional and the first sides of the first and the second gate dielectric material 7, 11 can also not be parallel with respect to the extending direction 19.

However, such a configuration is optional and a different configuration is for example shown in FIGS. 8 and 9 wherein the extending direction 19 is substantially perpendicular to the first sides 9, 13 of the first and the second gate dielectric material 7, 11.

FIGS. 8 and 9 further show that at least one, as shown in FIGS. 8 and 9 for example both, of the gates 6, 10 envelopes its respective adjacent semiconductor part 14, 15 such that at least one pair of opposing sides of the respective semiconductor material is provided with the gate 6, 10. FIGS. 8 and 9 being a top view of a cross-section of the tunnel transistor 1, the upper part of the first and the second gates 6, 10 extending from the first side 20 of the tunnel transistor 1 to the second side 21 of the tunnel transistor 1 over respectively the first and the second semiconductor part 14, 15 is not depicted.

As shown in the tunnel transistors of FIGS. 1, 7, 8 and 9 the first and the second gate 6, 10 are for example positioned on opposing sides of the contact region 16 and separated from each other by the extending direction 19 over a separation distance 22 along a direction perpendicular to the extending direction 19. However, this is optional and, for example in the embodiment according to FIGS. 8 and 9 in which the extending direction 19 is substantially perpendicular to the first sides 9, 13 of the first and the second gate dielectric material 7, 11, the first gate 6 and/or the second gate 10 can be located slightly overlapping part of the contact region 16, for example overlapping part of the junction 17 in FIG. 8 or for example overlapping part of the further layer 18 shown in FIG. 9, although not shown in the figures.

Preferably, the length of the first and the second gate electrode 8, 12 along the second side 46, 47 of respectively the first 9 and the second 13 gate dielectric material opposing the respective first side 9, 13 of the first 9 and the second 13 gate dielectric material substantially equals the length of the contact region 16 along the extending direction 19 in an embodiment of the tunnel transistor 1, wherein the first sides 9, 13 of the first and the second gate dielectric material 7, 11 oppose each other along opposing sides of the contact region 16, as for example shown in FIGS. 1 and 7. In such an embodiment it has been found that the effect of the gate-induced electrical field is further optimized as the coverage of the gate-induced electric field with respect to the contact region 16 is improved.

The first and the second semiconductor part 14, 15 can be doped with dopants such that, upon application of a source 4-drain 2 bias voltage in absence of an electrical potential difference between the first and the second gate 6, 10, a tunneling current is obtained across the contact region 16 between the drain 2 and the source 4.

This situation is for example exemplified by the FIGS. 2-6 showing band diagrams of such a transistor, in particular a transistor according to FIG. 1 in which the contact region 16 is a junction. The vertical Y axis shows the electron energy and the horizontal X axis shows the spatial dimension along a line drawn perpendicular with respect to the extending direction over the contact region 16. The figure shows the conduction band 48, the valence band 49, the Fermi level 50 of the holes at the second semiconductor part 15 and the Fermi level 51 of the electrons at the first semiconductor part 14.

Figure 2:
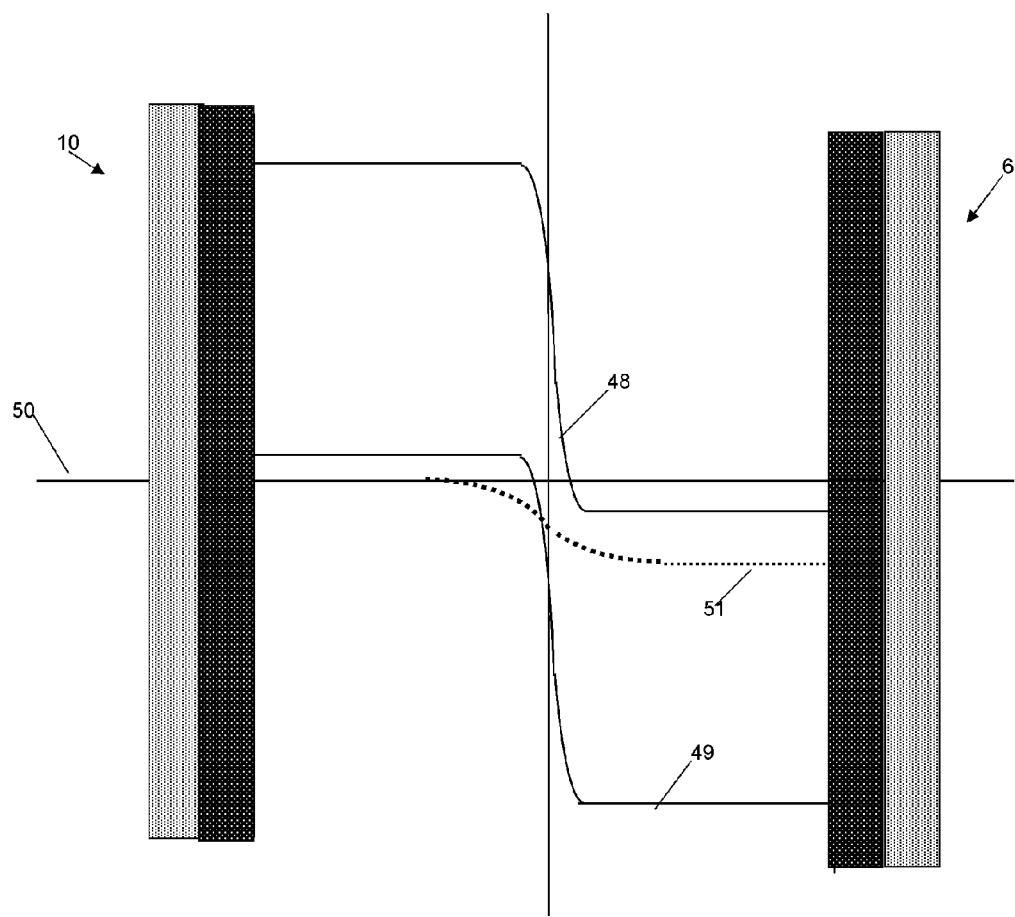
FIGS. 2-6 show band diagrams of an embodiment of the tunnel transistor.

In FIG. 2, the first 6 and the second 10 gate are grounded or provided with an electrical potential 0. It can be observed that the Fermi level 50 of the holes is positioned in the valence band 49 at the second semiconductor part 15 and in the conduction band 48 at the first semiconductor part 14, and that the Fermi level 51 of the electrons is below the Fermi level 50 of the holes by an amount representative for the source 4-drain 2 bias voltage. The energy of the valence band edge 49 of the second semiconductor 15 is above the energy of the conduction band edge 48 of the first semiconductor 14 allowing a current to flow between the drain 2 and the source 4 upon application of a source 4-drain 2 bias voltage, the tunnel transistor 1 and more particularly the contact region 16 therefore being in a conducting state.

Figure 3:
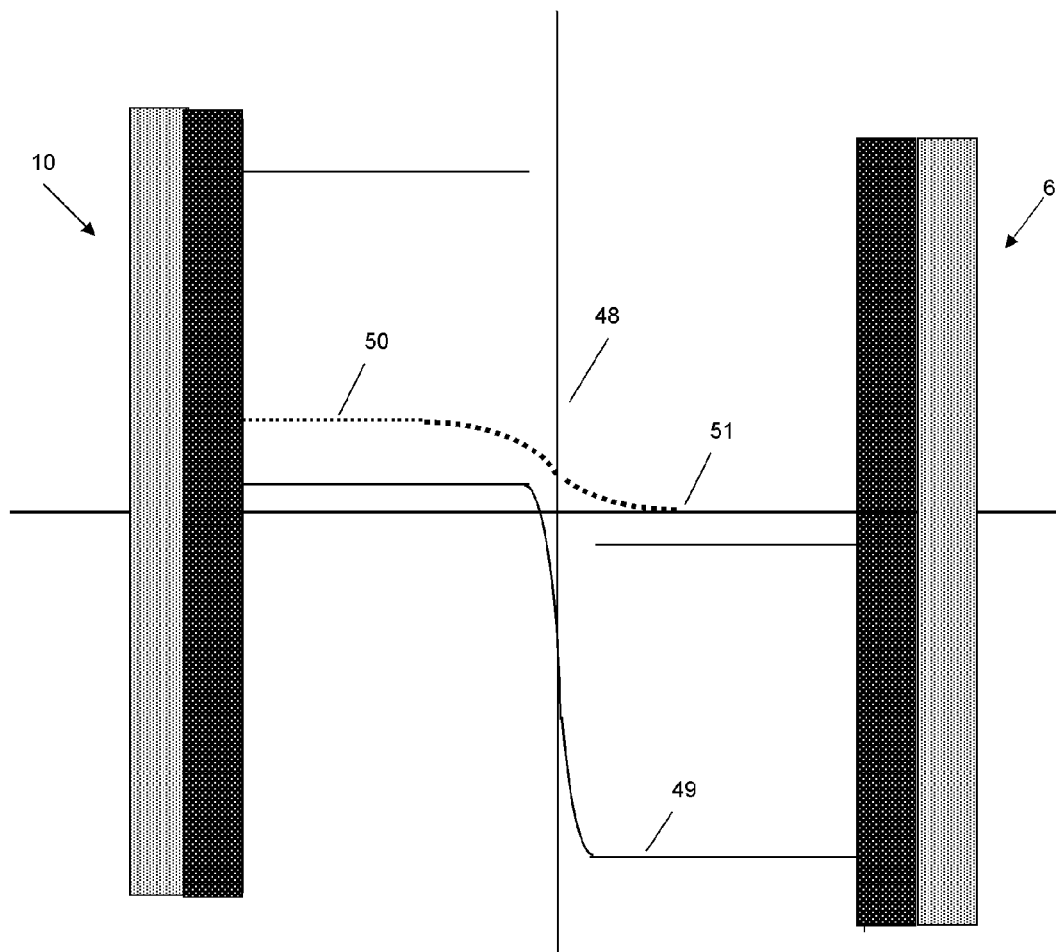

In FIG. 3, the first 6 and the second 10 gate are both provided with an identical electrical potential. It can be observed that now the Fermi level 51 of the electrons is positioned in the valence band 49 at the second semiconductor part 15 and in the conduction band 48 at the first semiconductor part 14, and that the Fermi level 50 of the holes is above the Fermi level 51 of the electrons by an amount representative for the source 4-drain 2 bias voltage. The energy of the valence band edge 49 of the second semiconductor 15 is above the energy of the conduction band edge 48 of the first semiconductor 14, allowing a current to flow between the drain 2 and the source 4 upon application of a source 4-drain 2 bias voltage, the tunnel transistor 1 and more particularly the contact region 16 therefore being in a conducting state.

Figure 4:
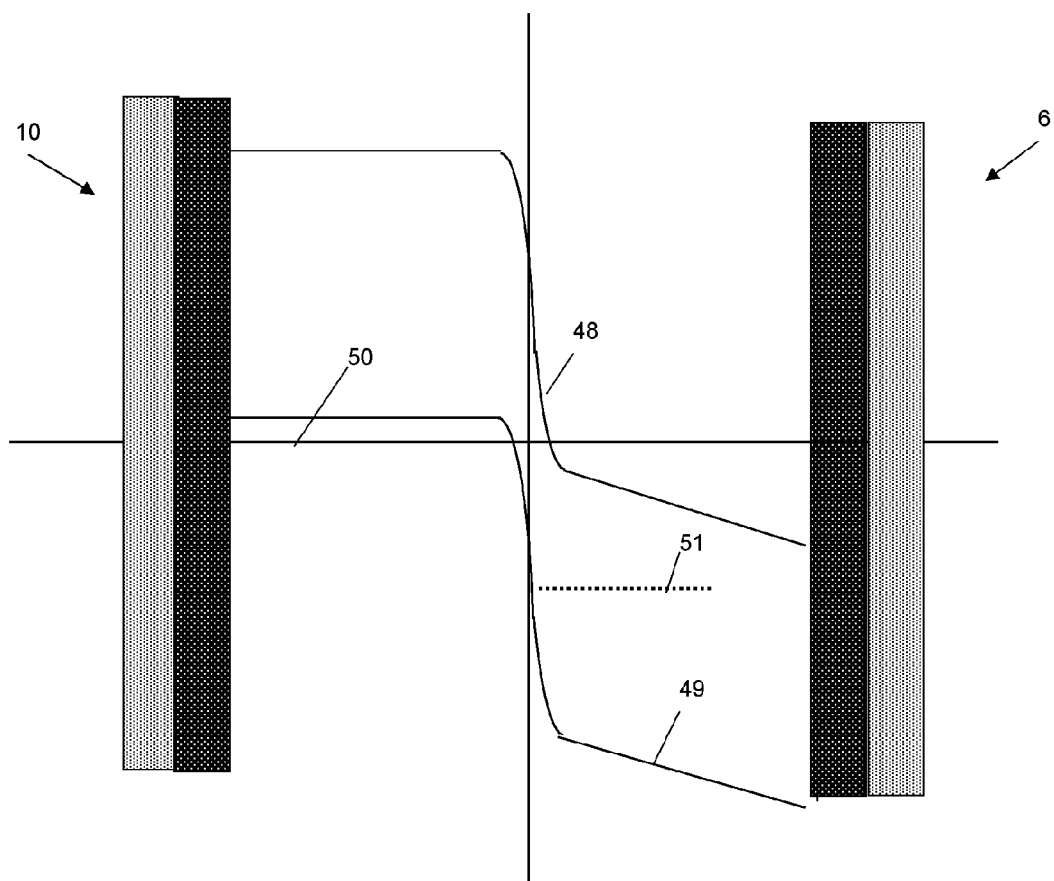

In FIG. 4, the second 10 gate is grounded or provided with an electrical potential 0 whereas the first gate 6 is provided with a positive non-zero electrical potential. It can be observed that the Fermi level 50 of the holes is positioned in the valence band 49 at the second semiconductor part 15 and in the conduction band 48 at the first semiconductor part 14, and that the Fermi level 51 of the electrons is below the Fermi level 50 of the holes by an amount representative for the source 4-drain 2 bias voltage. The energy of the valence band edge 49 of the second semiconductor 15 is above the energy of the conduction band edge 48 of the first semiconductor 14 allowing a current to flow between the drain 2 and the source 4 upon application of a source 4-drain 2 bias voltage, the tunnel transistor 1 and more particularly the contact region 16 therefore being in a conducting state. This configuration applies to the first semiconductor part 14 being fully depleted.

Figure 5:
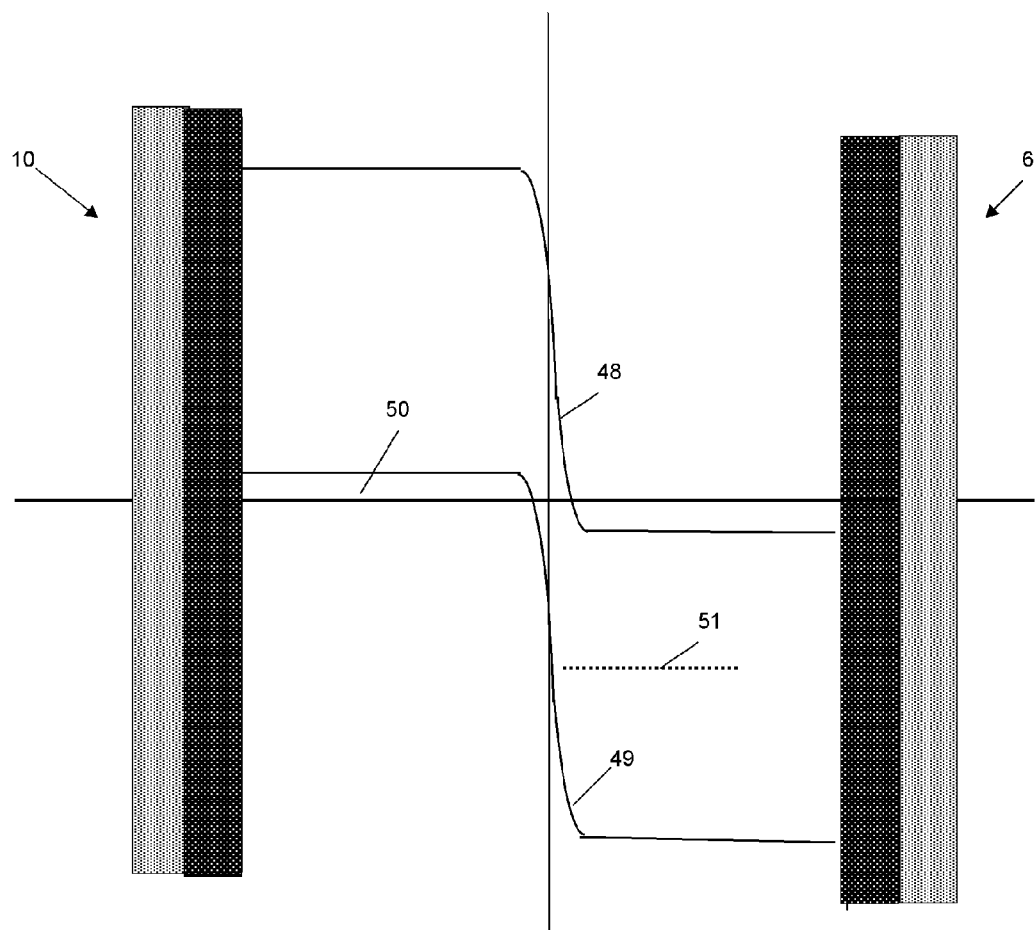

In FIG. 5 a similar situation is shown. This configuration applies to the first semiconductor part 14 not being fully depleted, such that the electric-field induced band bending is concentrated around the contact region only. This item, which is affected by the thickness and dopant concentration of the first semiconductor part, is an optional feature. The variation has been shown for the first semiconductor part, but it could also have appeared in the second semiconductor part, which in FIGS. 4 and 5 has been shown to not be fully depleted in both occasions.

Figure 6:
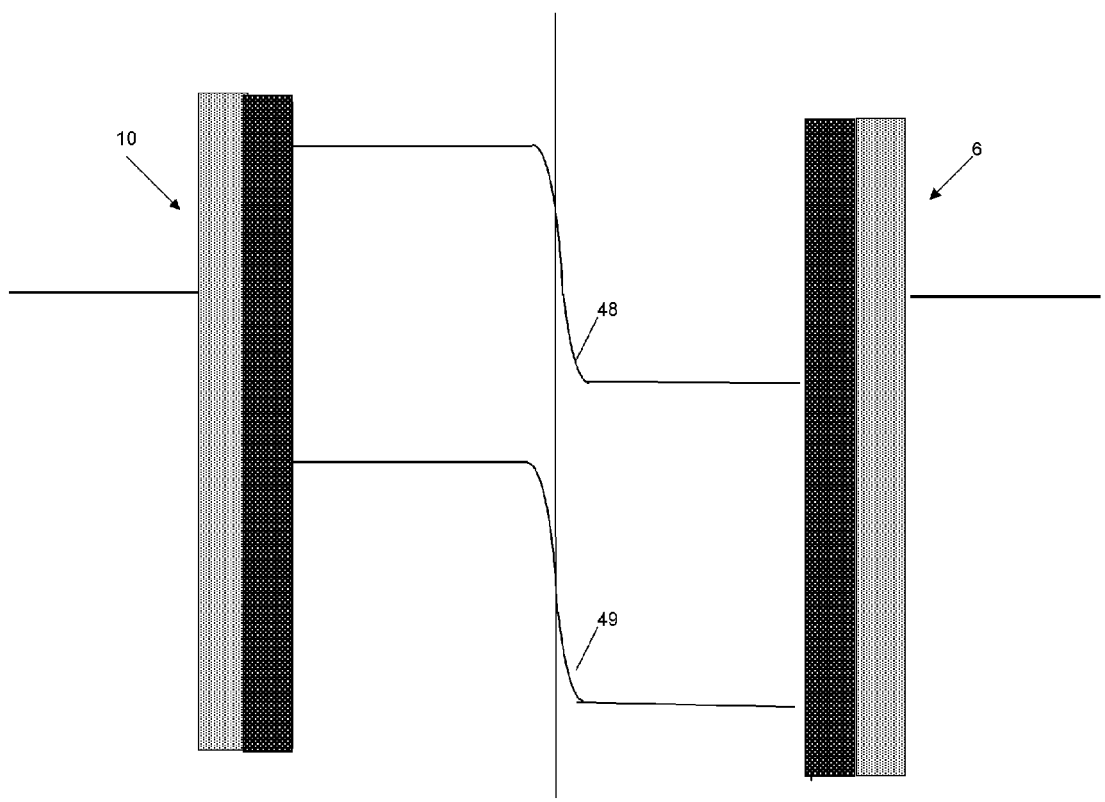

In FIG. 6, the first gate 6 is grounded or provided with an electrical potential 0, whereas the second gate 10 is provided with a positive non-zero electrical potential. The energy of the valence band edge 49 of the second semiconductor 15 is below the energy of the conduction band edge 48 of the first semiconductor 14, no longer allowing a current to flow between the drain 2 and the source 4 upon application of a source 4-drain 2 bias voltage, the tunnel transistor 1 and more particularly the contact region 16 therefore being in an isolating state.

However, by lowering the concentration of the dopants in the first and/or second semiconductor part 14, 15, with respect to the configuration as explained above, the first and the second semiconductor part 14, 15 are doped with dopants such that, upon application of a source 4-drain 2 bias voltage in absence of an electrical potential difference between the first and the second gate 6, 10, no substantial tunneling current is obtained across the contact region 16. In such a configuration the Fermi level will move inside the forbidden gap of at least one of the first and second semiconductor material such that the energy of the valence band edge 49 of the second semiconductor 15 is below the energy of the conduction band edge 48 of the first semiconductor.

Figure 10:
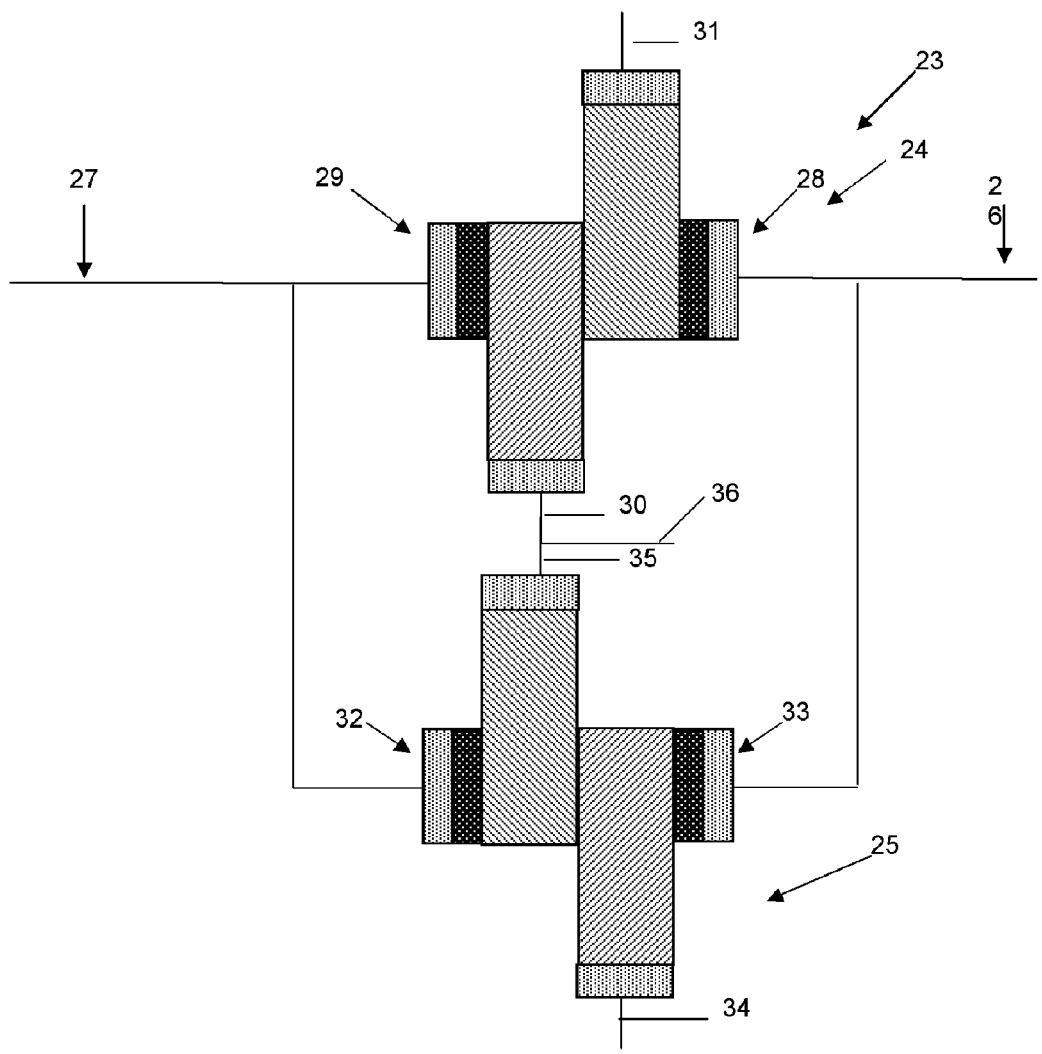
FIG. 10 shows an embodiment of a logical gate.
Figure 11:
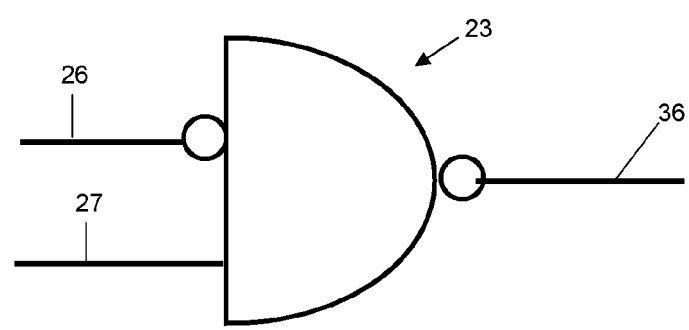
FIG. 11 shows a symbolic representation of the logical gate shown in FIG. 10.

FIG. 10 shows an embodiment of the logical gate 23. The logical gate 23 forms a NAND gate with a first inverted input 26. The symbol usually denoting such a logical gate 23 is for example shown in FIG. 11.

The logical gate 23 preferably comprises a first tunnel transistor 24 and a second tunnel transistor 25, as in embodiments presented herein.

In the first tunnel transistor 24, the first and the second semiconductor part are doped with dopants such that, upon application of a source 30-drain 31 bias voltage in absence of an electrical potential difference between the first and the second gate 28, 29, a tunneling current is obtained across the contact region between the drain 31 and the source 30.

In the second tunnel transistor 25, the first and the second semiconductor part are doped with dopants such that, upon application of a source 34-drain 35 bias voltage in absence of an electrical potential difference between the first and the second gate 32, 33, no substantial tunneling current is obtained across the contact region 16.

The first gate 28 of the first tunnel transistor 24 and the second gate 33 of the second tunnel transistor 25 are interconnected to the first inverted input 26 of the logical gate 23 such that a substantially identical electrical potential is applied to the first gate 28 of the first tunnel transistor 24 and the second gate 29 of the second tunnel transistor 25. The second gate 29 of the first tunnel transistor 24 and the first gate 32 of the second tunnel transistor 25 are interconnected to the second input 26 of the logical gate 23 such that a substantially identical electrical potential is applied to the second gate 29 of the first tunnel transistor 24 and the first gate 32 of the second tunnel transistor 25. The source 30 of the first transistor 24 and the drain 35 of the second transistor 25 are interconnected to the output 36 of the logical gate 23. The drain 31 of the first transistor 24 is provided to be connected to a supply voltage $V_{dd}$ and the source 34 of the second transistor 25 is provided to be connected to the ground.

Figure 12:
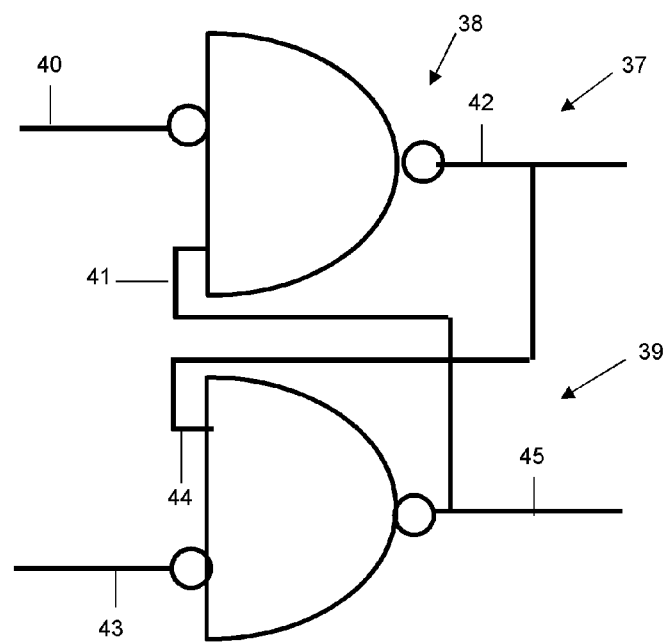
FIG. 12 shows a diagram of an embodiment of SRAM.

FIG. 12 shows how two such logical NAND gates 38, 39 with inverted first inputs 40, 43 can be combined into a static random-access memory (SRAM) 37.

Thereto, the second inputs 41, 44 and the outputs 42, 45 of the logical gates 38, 39 are interconnected, as shown in FIG. 12.

Although the inputs of such SRAM need to be inverted when compared to the SRAMs known to the person skilled in the art, such SRAM nevertheless allows a similar functionality using less transistors and therefore less heat production and power consumption.

A method for making a transistor according to certain embodiments is also provided.

An example of one such method is illustrated in FIGS. 13-25. The embodiment shown is especially suited for making tunnel transistors according to the disclosure wherein the first sides 9, 13 of the first and the second gate dielectric material 7, 11 oppose each other along opposing sides of the contact region 16, as for example shown in FIG. 1.

In a first step a fin 52 is provided. The fin 52 is made of a first semiconductor material 57. The fin 52 in FIG. 13 is for example made of a semiconductor material doped with p-type dopants and will later form the second semiconductor part 15 of the tunnel transistor 1. This is, however, optional and the first semiconductor material 57 can also be doped with n-type dopants, later forming the first semiconductor part 14 of the transistor 1.

The fin 52 comprises a hard mask 53 at its upper surface 54. The hard mask 53 can be any hard mask deemed appropriate by the person skilled in the art taking into account later steps during making the tunnel transistor 1.

Figure 13A:
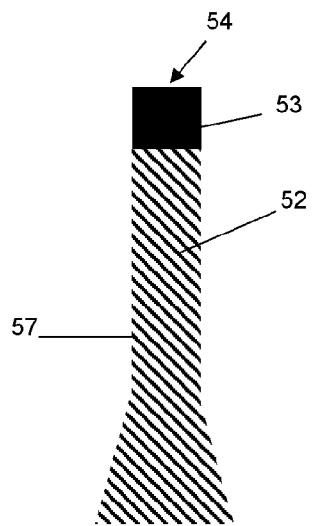
FIGS. 13a,b-25a,b,c illustrate a method for making a tunnel transistor.
Figure 13B:
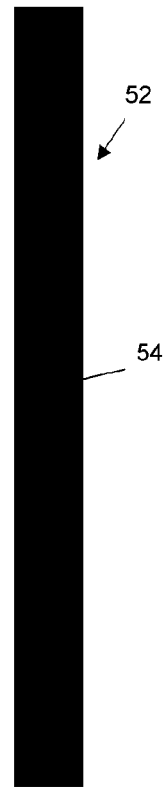
Figure 14A:
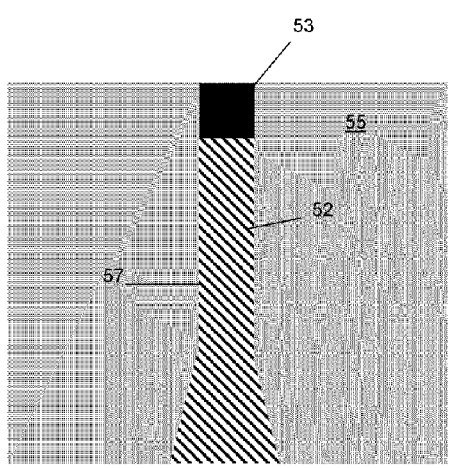
Figure 14B:
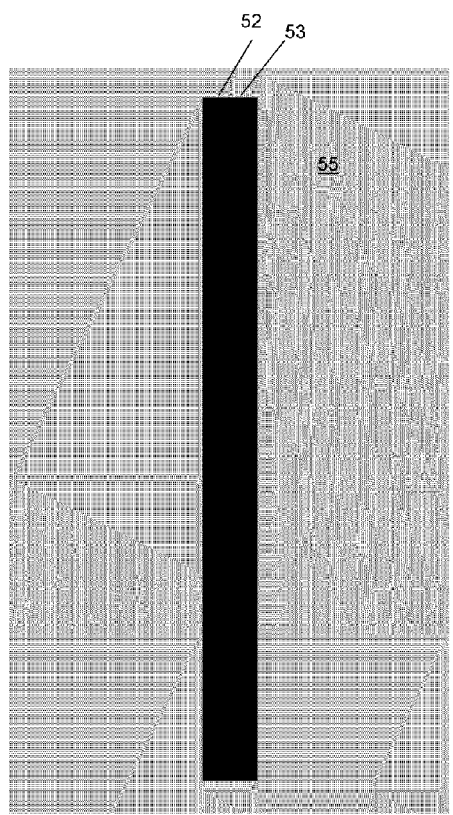

FIG. 13a shows a cross section of the fin 52, while FIG. 13b shows a top view of the fin 52 on a substrate (not shown). The fin 52 can for example be produced on the substrate using known techniques such as fin patterning while maintaining the hard mask 53.

In a subsequent step an oxide 55 is applied around and on top of the fin 52 such that the fin 52 is embedded in the oxide 55. After having embedded the fin 52 with the oxide 55, the top of the resulting structure is polished down to the hard mask 53. The polishing of the structure down to the hard mask 53 can be done using any known polishing technique but preferably is done using so-called chemical mechanical polishing (CMP) selective to the hard mask 53. As oxide 55 has been applied over en next to the hard mask 53, the hard mask 53 is different from the oxide 55. A cross section of the resulting structure is for example shown in FIG. 14a. A top view of the resulting structure is for example shown in FIG. 14b.

Figure 15A:
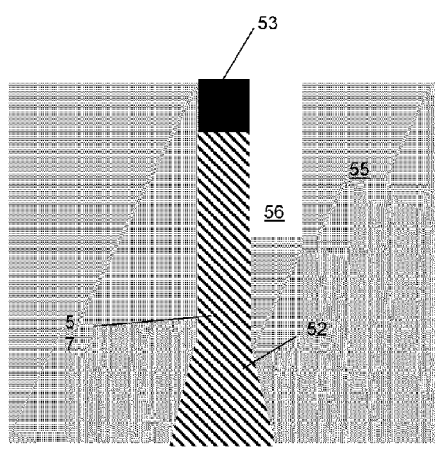
Figure 15B:
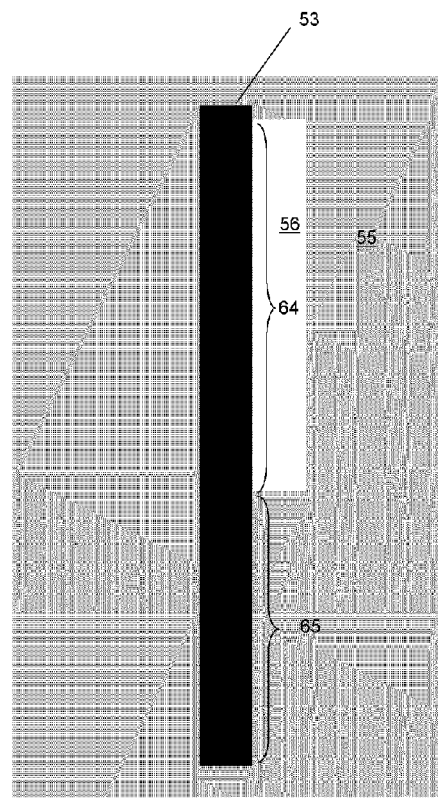

In a subsequent step, an opening 56 adjacent to the fin 52, more in particular along the first doped semiconductor material 57, is made along a first part 64 of the length of the fin 52. The opening 56 preferably is made using a method selective to the hard mask 53 such that the first doped semiconductor material 57 of the fin 52 is protected against the method making the opening 56. Preferably, the opening 56 is made using etching. FIG. 15a shows a cross section after application of the opening 56, while FIG. 15b shows a top view.

The opening 56 is at least partly filled, for example with epitaxial growth, with second doped semiconductor material 58, the first and the second doped semiconductor material 57, 58 being oppositely doped by n-type and p-type dopants. Thus a second fin 66 of second doped semiconductor material 58 is formed. For example, the first doped semiconductor material 57 is doped with p-type dopants, the first doped semiconductor material 57 forming the second semiconductor part 15 in the finished tunnel transistor 1, whereas the second doped material 58 is doped with n-type dopants. However, the first doped semiconductor material 57 can also be doped with n-type dopants, forming the first semiconductor part 14 in the finished tunnel transistor 1, whereas the second doped material 58 is doped with p-type dopants, forming the second semiconductor part 14 in the finished tunnel transistor 1.

Figure 16A:
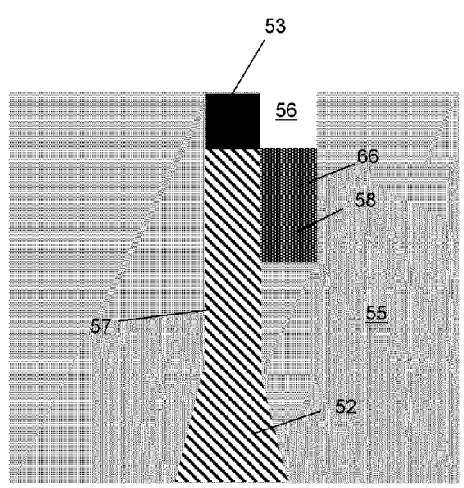
Figure 16B:
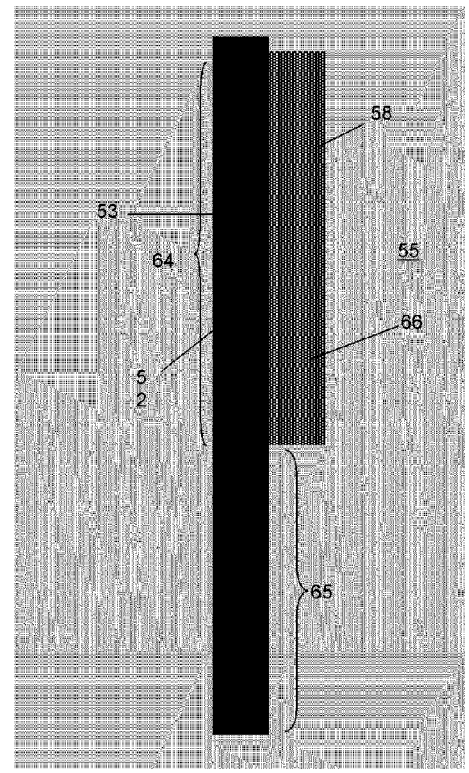

FIG. 16a shows a cross section after completely filling the opening 56 up to the hard mask 53 with the second doped semiconductor material 58. FIG. 16b shows a top view of FIG. 16a.

Although FIG. 16a shows only that the second doped semiconductor material 58 is used for filling the opening 56, this is optional and the opening 56 can also be filled with a material forming the further layer 18 in between the first and the second doped semiconductor material 57, 58.

Preferably, the opening 56 is filled via selective epitaxial growth, and as a result, the semiconductor material 58 fills the opening up to the hard mask 53 leaving the opening 56 next to the hard mask 53 unfilled with the second doped semiconductor material 58, as in a later step the hard mask 53 will be removed together with adjacent material of the opening 56, thus also removing any second doped semiconductor material

58. Moreover, by filing up to the hard mask 53 it is avoided that in a later step after removing the hard mask 53, part of the fin 52 needs to be removed to obtain a top surface of the structure in which the first and the second doped semiconductor material 57, 58 are adjacent.

Figure 17A:
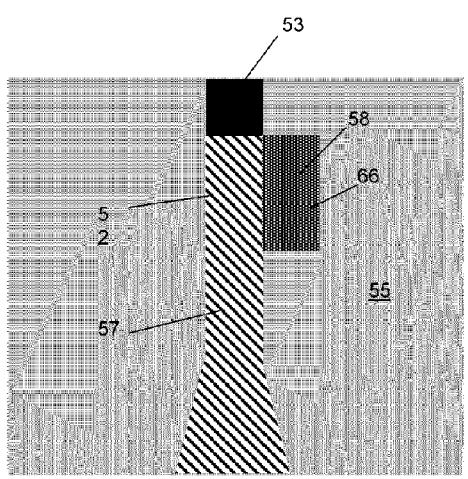
Figure 17B:
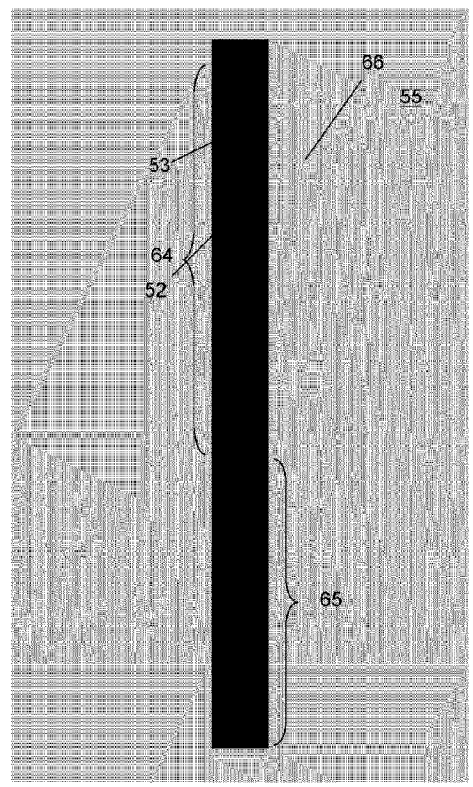

In a subsequent preferred step, oxide 55 is again applied on top of the obtained structure after which the top is again polished down to the hard mask 53. FIG. 17a shows a cross section of the structure after polishing down to the hard mask 53. FIG. 17b shows a top view of FIG. 17a. This step can however be omitted if the first fin 52 and the hard mask 53 can be partly removed with sufficient selectivity with respect to the second fin 66.

Figure 18A:
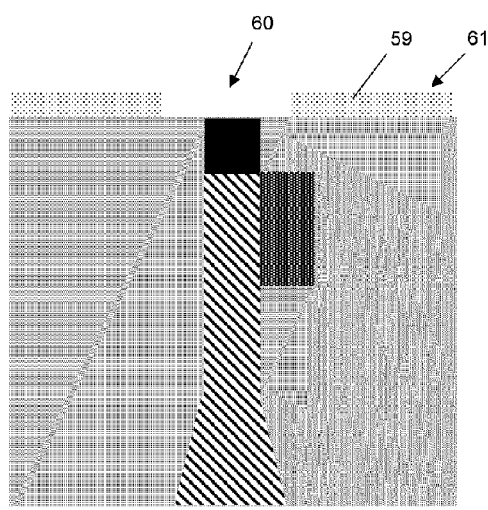
Figure 18B:
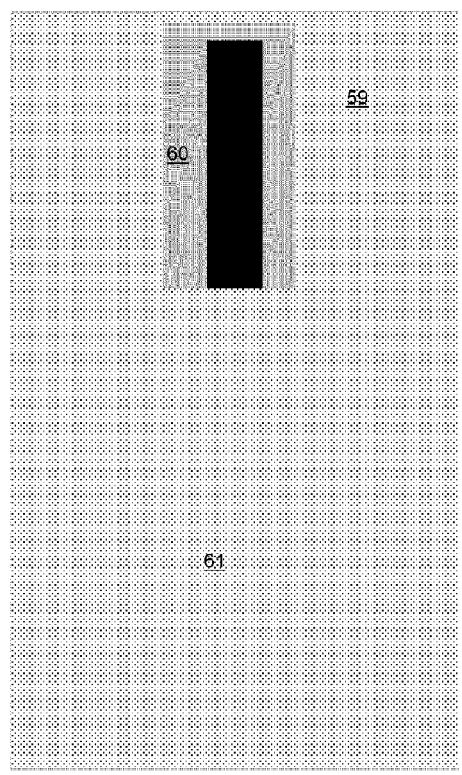

Subsequently, a resist 59 is patterned such that an exposed part 60 of the first part of the fin 52 is exposed and a covered part 61 of the first part of the fin 52 is covered with the resist 59. FIG. 18a shows a cross section after patterning the resist 59. FIG. 18b shows a top view of FIG. 18a.

Figure 19A:
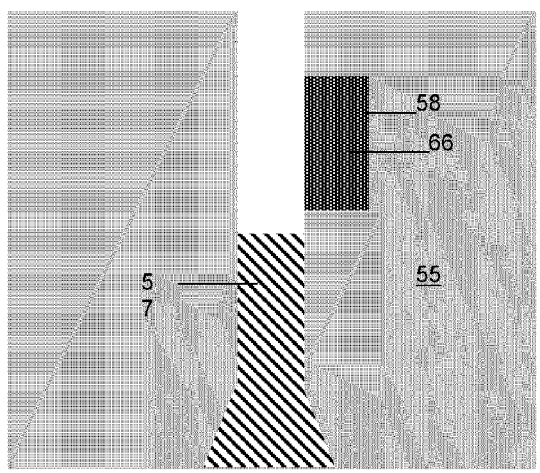
Figure 19B:
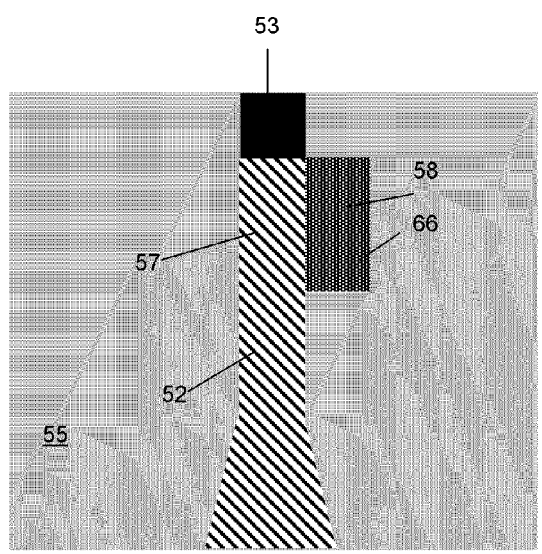
Figure 19C:
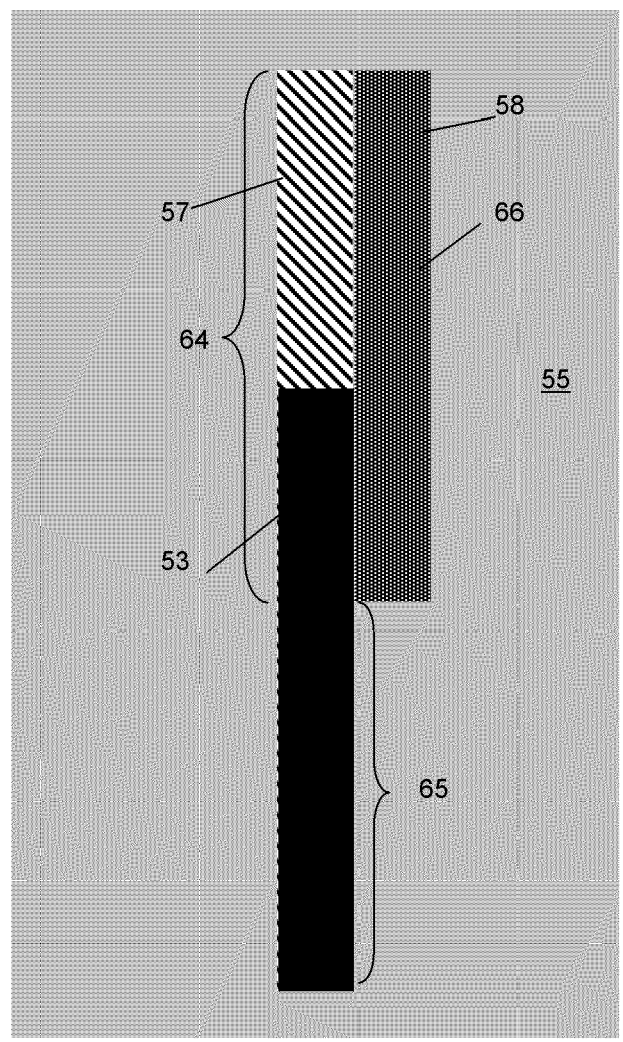

Subsequently, the exposed part 60 of the fin 52 is etched back such that the hard mask 53 is etched back after which part of the first doped semiconductor material 57 is etched back, preferably selectively etched back, such that the exposed part 61 of the fin 52 is etched back to below the second doped semiconductor material 58 such that the first doped semiconductor material 57 of the exposed part 60 and the second doped semiconductor material are no longer adjacently positioned with respect to each other, and more specifically are no longer in electrical contact with each other, such that at the exposed part 60 of the first fin 52 the occurrence of tunneling current between the first and the second doped semiconductor material 57, 58 is strongly reduced or even no longer possible. This is for example shown in FIG. 19a showing a cross section of the exposed part 60 of the fin 52, FIG. 19b showing a cross section of the covered part 61 of the fin 52 and FIG. 19c showing a top view of the fin 52 and thus of FIGS. 19a and 19b.

Figures 20A, 20B:
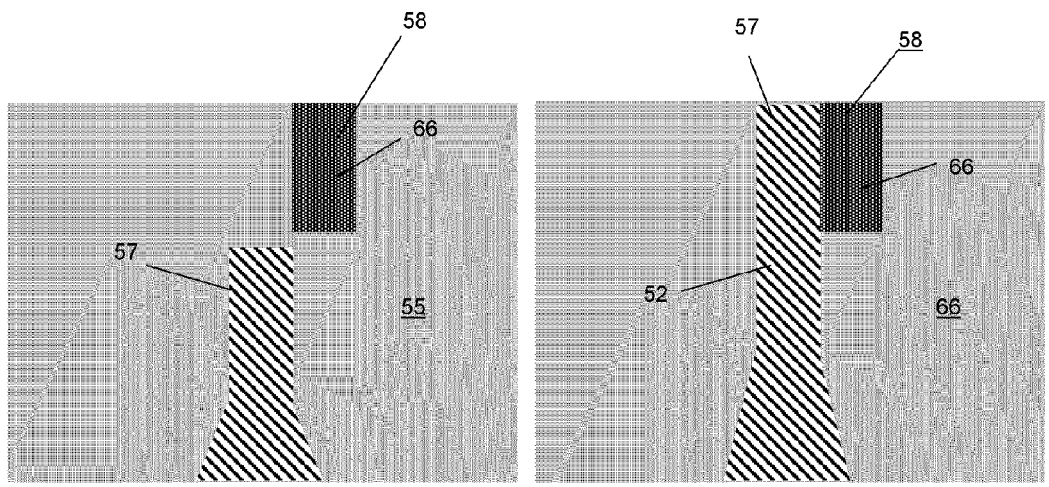
Figure 20C:
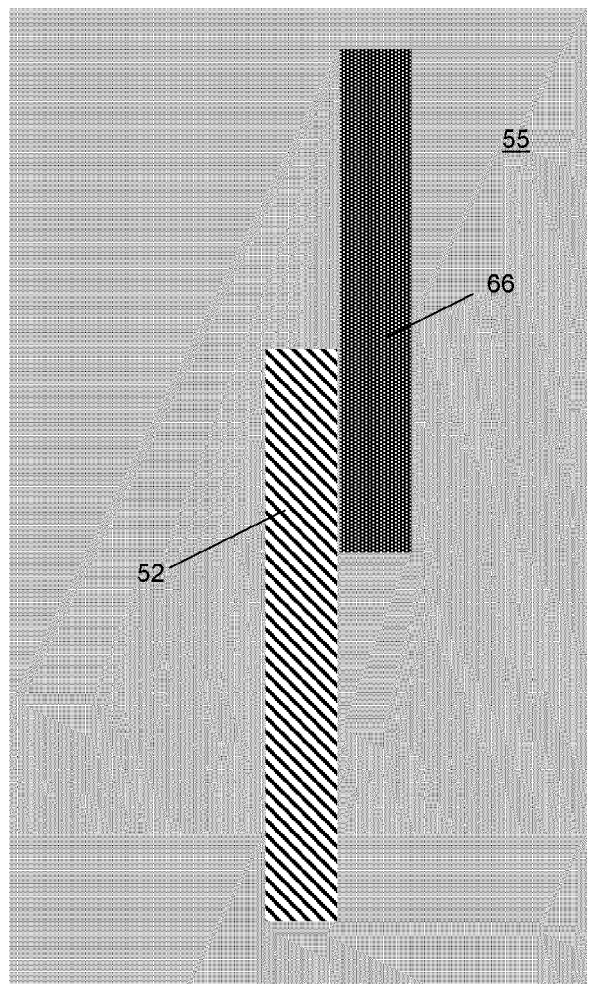

Subsequently, the hard mask 53 is etched back over the remainder of the first part 64 and at least part of a second part 65 of the length of the fin 52 separate from the first part 64 of the fin 52, again applying oxide 55 on top of the obtained structure and polishing the top down to the second fin 66. A cross section at the exposed part 60 of the fin 52 of the resulting structure is shown in FIG. 20a. FIG. 20b shows a cross section at the covered part 61 of the fin 52 of the resulting structure. FIG. 20c shows an overall top view of the resulting structure.

Figures 21A, 21B:
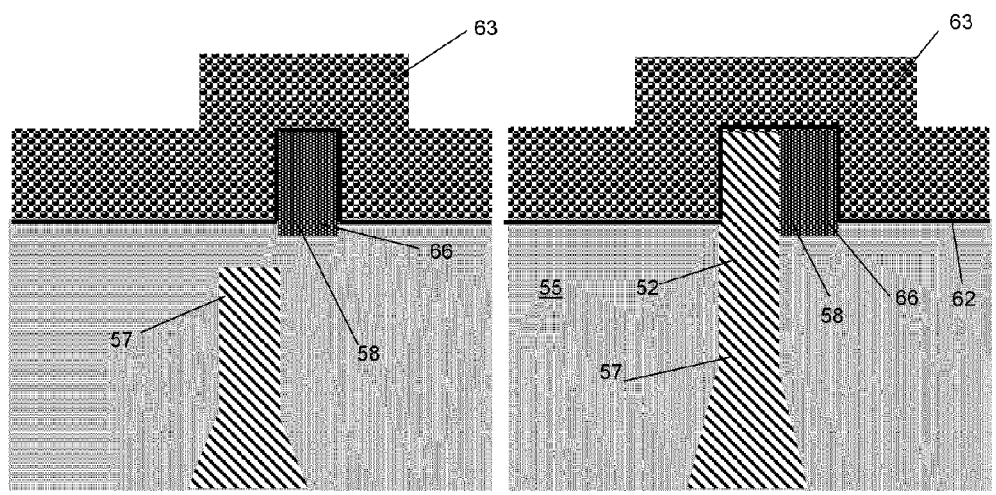
Figure 21C:
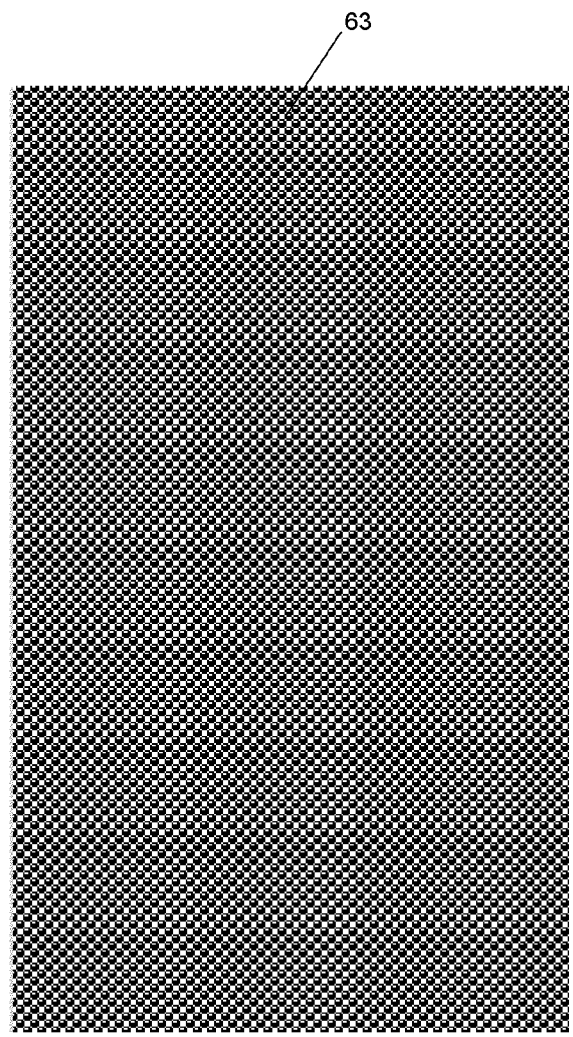

In a subsequent step the oxide 55 is recessed such that the exposed part 60 of the fin 52 is covered with the oxide 55 and the covered part 61 of the first and the second doped semiconductor material 57, 58 protrude from the oxide 55 and the whole is covered with a gate stack comprising the gate dielectric material 62 and the gate electrodes 63. A cross section at the exposed part 60 of the fin 52 of the resulting structure is shown in FIG. 21a. FIG. 21b shows a cross section at the covered part 61 of the fin 52 of the resulting structure. FIG. 21c shows an overall top view of the resulting structure. Preferably, the gate stack is applied such that the thickness of the gate stack substantially equals the height of the second fin 66 with which it extends from the oxide 55, as shown in FIGS. 21a and 21b.

Figures 22A, 22B:
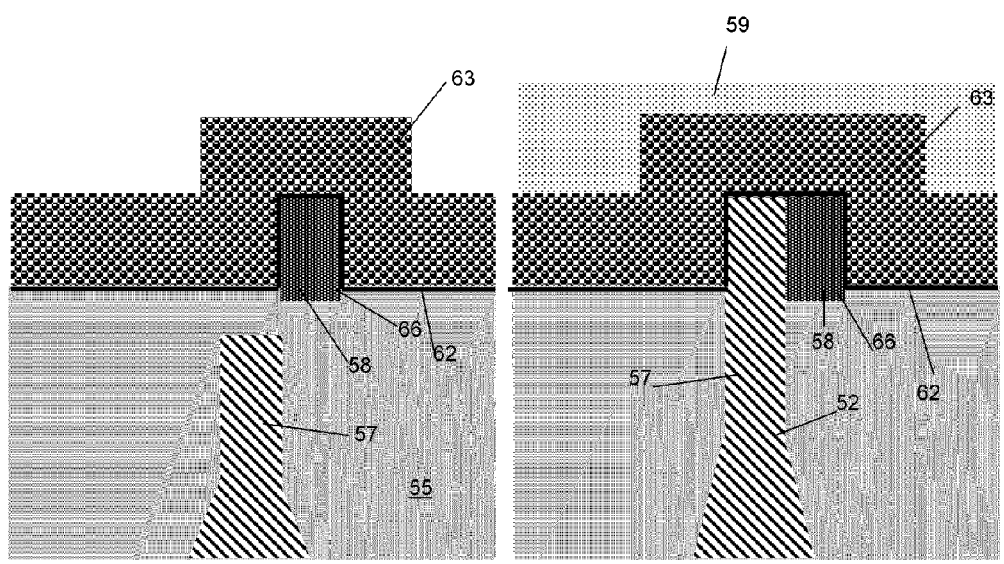
Figure 22C:
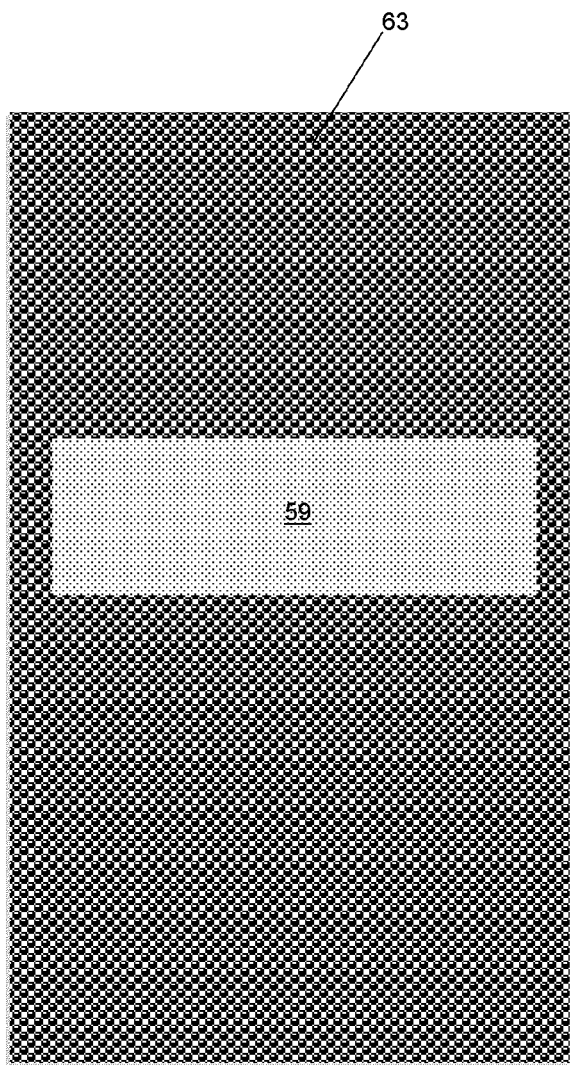

Subsequently, resist 59 is applied over the contact region 16 for forming the first and the second gate 6, 10 as shown in FIGS. 22a, 22b and 22c. A cross section at the exposed part 60 of the fin 52 of the resulting structure is shown in FIG. 22a. FIG. 22b shows a cross section at the covered part 61 of the fin 52 of the resulting structure. FIG. 22c shows an overall top view of the resulting structure.

Figure 23A:
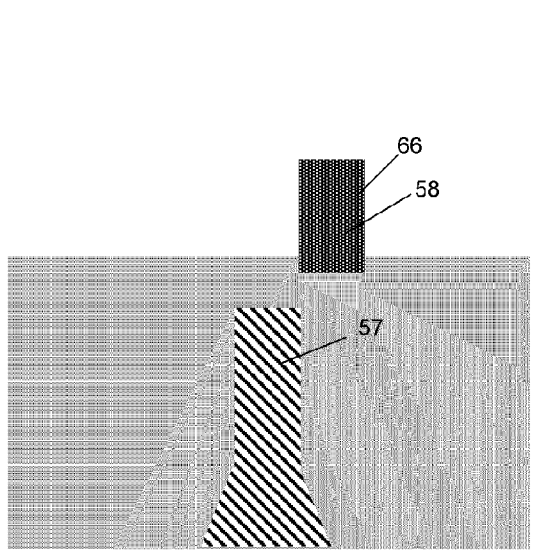
Figure 23B:
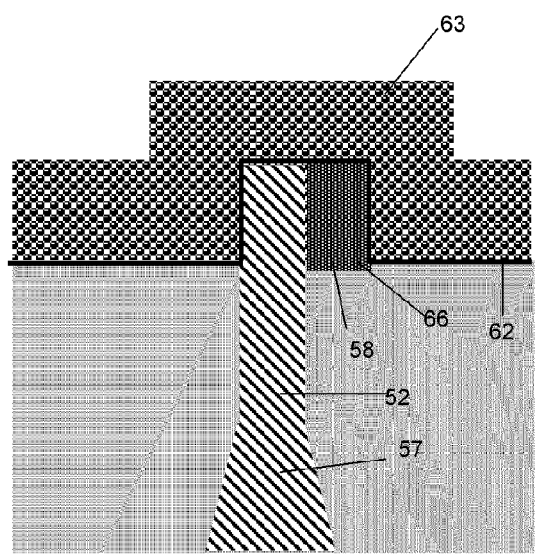
Figure 23C:
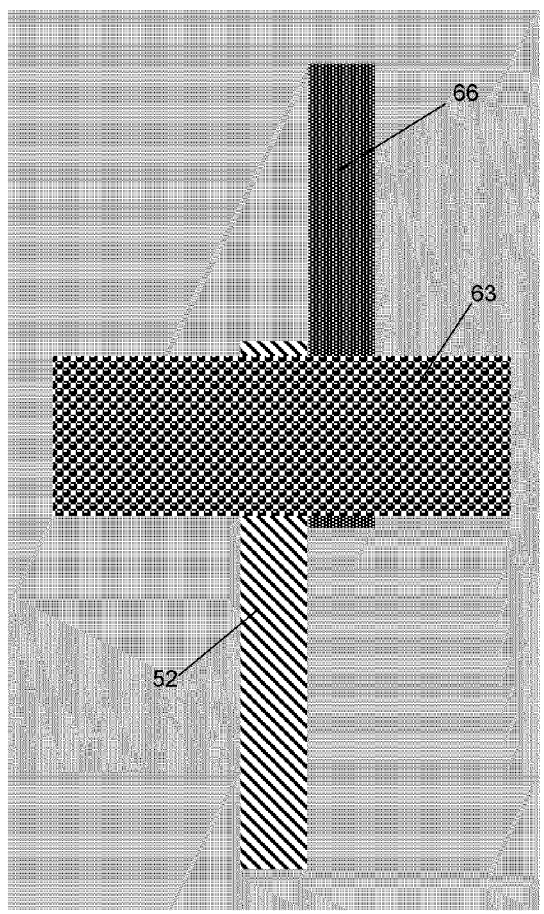

Subsequently, the gate stack is removed from the top uncovered by the resist 59. A cross section at the exposed part 60 of the fin 52 of the resulting structure is shown in FIG. 23a. FIG. 23b shows a cross section at the covered part 61 of the fin 52 of the resulting structure. FIG. 23c shows an overall top view of the resulting structure.

Figure 24A:
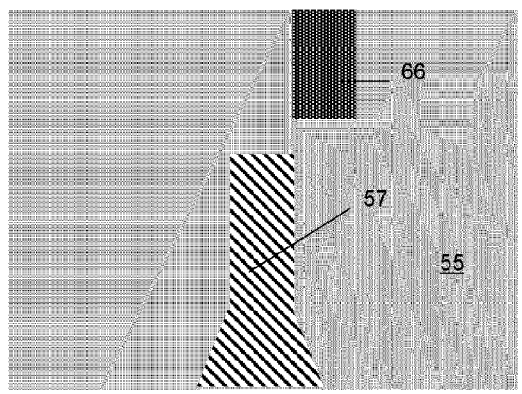
Figure 24B:
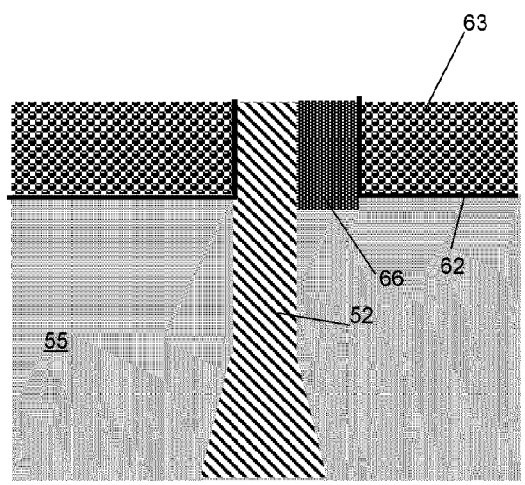
Figure 24C:
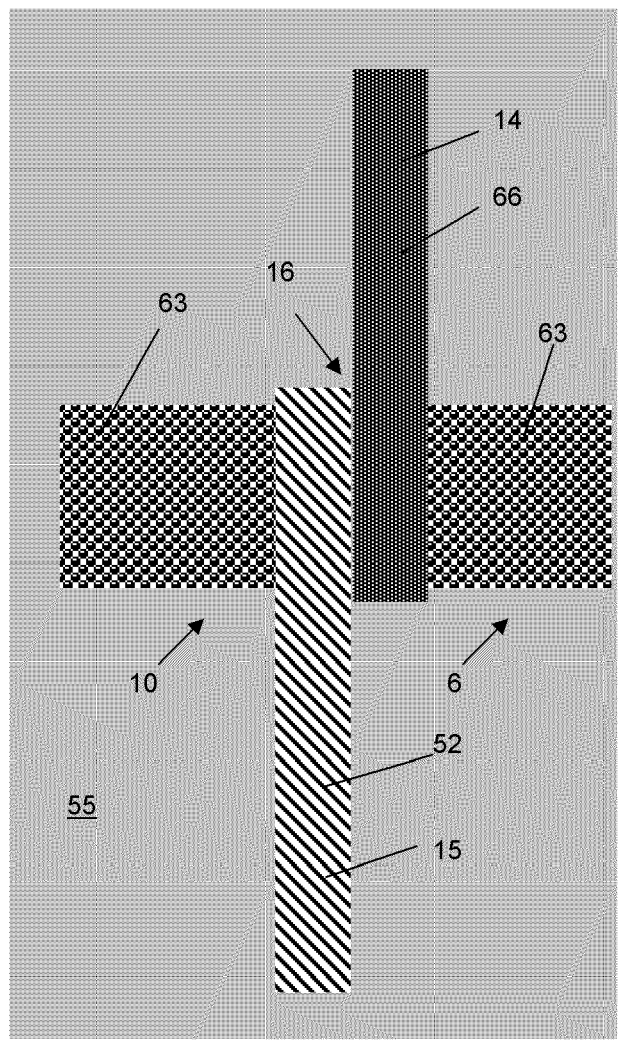

Subsequently, oxide 55 is further applied to the structure and then the structure is polished down to the second doped semiconductor material 58, the gate stack being separated into the first and the second gate 6, 10. A cross section at the exposed part 60 of the fin 52 of the resulting structure is shown in FIG. 24a. FIG. 24b shows a cross section at the covered part 61 of the fin 52 of the resulting structure. FIG. 24c shows an overall top view of the resulting structure. Preferably, the polishing is done using chemical mechanical polishing.

Figure 25A:
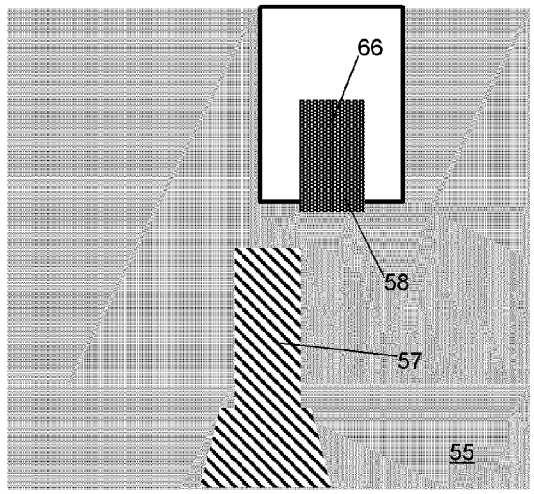
Figure 25B:
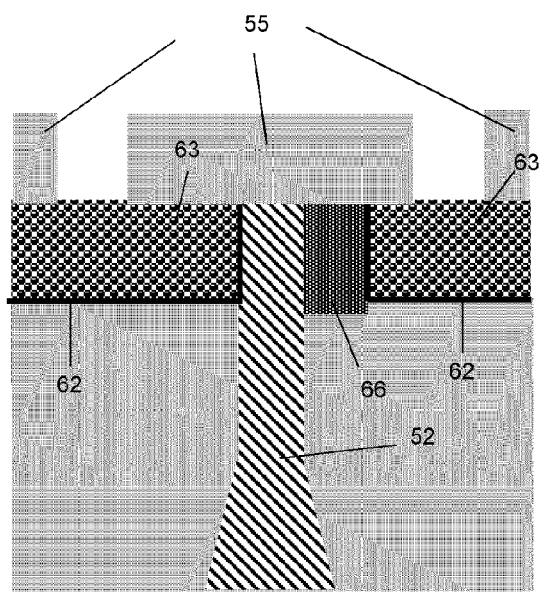
Figure 25C:
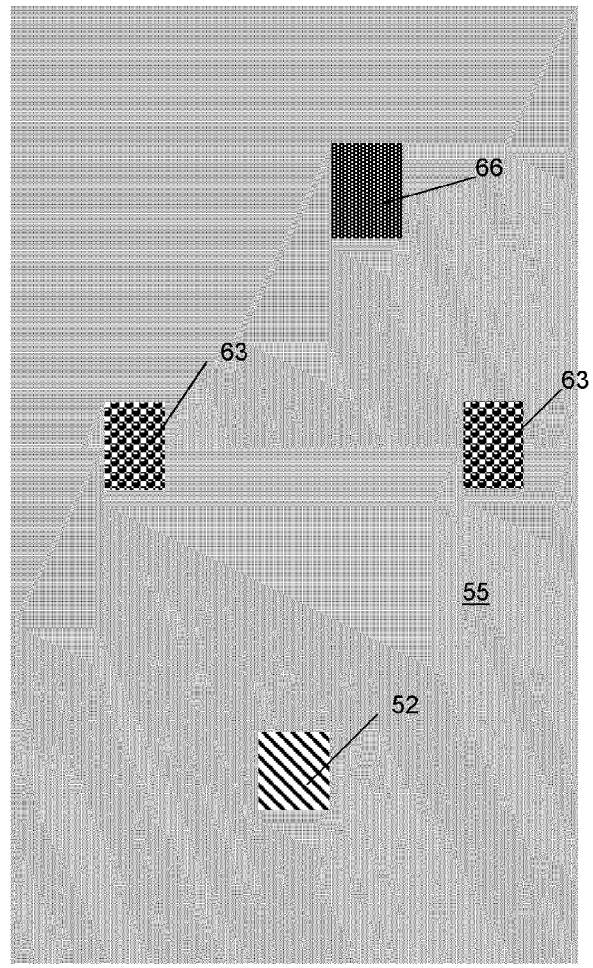

Preferably, in a further subsequent step pre-metal dielectric material (PMD material), for example a material comprising oxide, is applied to the structure, furthermore is preferably patterned and subsequently preferably holes are etched in it such that only part of the first and the second doped semiconductor material 57, 58, part of the first gate 6 and part of the second gate 10 are uncovered by the PMD material for, for example, being connected into a circuit, for example by a wrap-around contact. A cross section at the exposed part 60 of the fin 52 of the resulting structure is shown in FIG. 25a. FIG. 25b shows a cross section at the covered part 61 of the fin 52 of the resulting structure. FIG. 25c shows an overall top view of the resulting structure.

Although the method described above can be applied for making the tunnel transistor, with for example slight modifications to allow for the different positioning of the gate with respect to the contact region, wherein the extending direction 19 is substantially perpendicular to the first sides 9, 13 of the first and the second gate dielectric material 7, 11 and wherein the longitudinally extending first and second semiconductor part 14, 15 are positioned substantially in line, the method for making such a tunnel transistor can be simplified. For example such a transistor can be made by similarly to the method described above providing a fin 52 made of a first doped semiconductor material 57 on a substrate with a layer of hard mask 53 applied at the upper face 54 of the fin 52, applying oxide around the fin 52 and polishing the top down to the hard mask 53, making an opening 56 adjacent to the fin 52 such that the first fin 52 and the opening are in line with each other, at least partly filling the opening 56 with second doped semiconductor material 58 such as to make the contact region 16, the first and the second doped semiconductor material 57, 58 being oppositely doped by n-type and p-type dopants, again applying oxide 55 on top of the obtained structure and again polishing the top down to the hard mask 53, etching back the hard mask 53 and recessing the oxide surrounding the first and second doped semiconductor material 57, 58 such as to create the two fins 52, 66 and applying a gate stack on top of the first and the second fin, applying respective resist masks over respectively the first and the second semiconductor part 14, 15 for forming the first and the second gate (6, 10) and removing the gate stack from the top uncovered by the resist (59). Possibly, in a further subsequent step pre-metal dielectric material (PMD material) is applied to the top and openings are etched such that only part of the first and the second doped semiconductor material, part of the first gate and part of the second gate are uncovered by the PMD material for, for example, being connected into a circuit.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The invention claimed is:

1. A tunnel transistor, comprising:
a drain electrode;
a source electrode;

a drain comprising a first semiconductor part doped with n-type dopants in electrical contact with the drain electrode;

a source comprising a second semiconductor part doped with p-type dopants in electrical contact with the source electrode;

a first gate comprising a first gate dielectric material adjacent to the first semiconductor part along and contacting, with a first side of the first gate dielectric material; and a second gate separate from the first gate and configured to control a current between the drain and the source, the second gate comprising a second gate dielectric material adjacent to the second semiconductor part along and contacting, with a first side of the second gate dielectric material, wherein the first semiconductor part is situated at a first side of the tunnel transistor and the first gate electrode is situated along the first gate dielectric material and opposing the first side of the first gate dielectric material, wherein the drain and the source are positioned adjacently to each other along a contact region of the tunnel transistor, wherein the contact region longitudinally extends along an extending direction, wherein the second semiconductor part at a second side of the tunnel transistor and a second gate electrode along the second gate dielectric material and opposing the first side of the second gate dielectric material, the first and the second gate are configured to control current between a substantially conducting state and a substantially isolating state between the drain and the source by an electrical potential difference between the first and the second gate generating a gate-induced electric field between the first and the second gate, wherein the first and second gate electrode are positioned substantially along respectively the first and the second semiconductor part, and wherein the first and the second gate, with respect to each other and with respect to the first and the second semiconductor part, are configured such that an electric field, induced by the electrical potential difference between the first and the second gate, is created through the contact region such that the field lines of the electric field intersect with the extending direction.

2. The tunnel transistor according to claim 1, wherein the second side of the tunnel transistor opposes the first side of the tunnel transistor.

3. The tunnel transistor according to claim 1, wherein the first and the second gate are positioned on opposing sides of the contact region and separated from each other by the extending direction over a separation distance along a direction perpendicular to the extending direction.

4. The tunnel transistor according to claim 1, wherein the first and the second semiconductor part are doped with dopants such that, upon application of a source-drain bias voltage in absence of an electrical potential difference between the first and the second gate, a tunneling current is obtained across the contact region between the drain and the source.

5. The tunnel transistor according to claim 1, wherein the first and the second semiconductor part are doped with dopants such that, upon application of a source-drain bias voltage in absence of an electrical potential difference between the first and the second gate, no substantial tunneling current is obtained across the contact region.

6. The tunnel transistor according to claim 1, wherein the first and the second semiconductor part contact each other along a junction forming the contact region.

7. The tunnel transistor according to claim 1, wherein the contact region is a further layer applied between the first and second semiconductor part.

8. The tunnel transistor according to claim 7, wherein the further layer is a third semiconductor part.

9. The tunnel transistor according to claim 8, wherein the third semiconductor part is an intrinsic semiconductor or is doped with a doping ratio of less than $10^{18}$ atoms per $cm^3$.

10. The tunnel transistor according to claim 8, wherein the third semiconductor part is an intrinsic semiconductor or is doped with a doping ratio of less than $10^{17}$ atoms per $cm^3$.

11. The tunnel transistor according to claim 1, wherein the first sides of the first and the second gate dielectric material oppose each other along opposing sides of the contact region.

12. The tunnel transistor according to claim 11, wherein the first sides of the first and the second gate dielectric material are substantially parallel with respect to the extending direction.

13. The tunnel transistor according to claim 1, wherein the extending direction is substantially perpendicular to the first sides of the first and the second gate dielectric material.

14. The tunnel transistor according to claim 13, wherein at least one of the gates envelopes its respective adjacent semiconductor part such that at least one pair of opposing sides of the respective semiconductor material is provided with the gate.

15. The tunnel transistor according to claim 1, wherein an electric field, induced by an electrical potential difference between the first and the second gate, is created through the contact region such that field lines of the electric field intersect with the extending direction.

16. A logical gate forming a NAND gate with a first inverted input, comprising a first tunnel transistor and a second tunnel transistor according to claim 1, wherein in the first tunnel transistor, the first and the second semiconductor part of the first tunnel transistor are doped with dopants such that, upon application of a source-drain bias voltage in absence of an electrical potential difference between the first and the second gate of the first tunnel transistor, a tunneling current is obtained across the contact region between the drain and the source of the first tunnel transistor;

wherein in the second tunnel transistor, the first and the second semiconductor part of the second tunnel transistor are doped with dopants such that, upon application of a source-drain bias voltage in absence of an electrical potential difference between the first and the second gate of the second tunnel transistor, no substantial tunneling current is obtained across the contact region of the second tunnel transistor; and wherein the first gate of the first tunnel transistor and the second gate of the second tunnel transistor are interconnected to the first inverted input of the logical gate such that a substantially identical electrical potential is applied to the first gate of the first tunnel transistor and the second gate of the second tunnel transistor, in that the second gate of the first tunnel transistor and the first gate of the second tunnel transistor are interconnected to the second input of the logical gate such that a substantially identical electrical potential is applied to the second gate of the first tunnel transistor and the first gate of the second tunnel transistor and in that the source of the first transistor and the drain of the second transistor are interconnected to the output of the logical gate, the drain of the first transistor is configured to be connected to a supply voltage $V_{dd}$ and the source of the second transistor is configured to be connected to ground.

17. A static random-access memory comprising two logical gates according to claim 16.

18. A static random-access memory according to claim 17, wherein the second inputs and the outputs of the logical gates are interconnected.

19. A method for making a tunnel transistor, comprising, in sequence:
- providing a fin made of a first doped semiconductor material on a substrate with a layer of hard mask applied at an upper face of the fin;
- applying a first oxide around the fin;
- polishing a top of the first oxide down to the hard mask, thereby making an opening adjacent to the fin along a first part of a length of the fin;
- at least partly filling the opening with a second doped semiconductor material, thereby making a contact region, the first and the second doped semiconductor materials being oppositely doped by n-type and p-type dopants, whereby a first structure is obtained;
- applying a second oxide on top of the first structure;
- polishing a top of the second oxide down to the hard mask, whereby a second structure is obtained;
- applying a first resist to the second structure;
- patterning the first resist such that an exposed part of the first part of the fin is exposed and a covered part of the first part of the fin is covered with the first resist;
- etching back the exposed part of the fin such that the hard mask is etched back;
- etching back part of the first doped semiconductor material such that the exposed part of the fin is etched back to below the second doped semiconductor material, such that the first doped semiconductor material of the exposed part and the second doped semiconductor material are no longer adjacently positioned with respect to each other;
- etching back the hard mask over a remainder of the first part and at least a part of a second part of the length of the fin separate from the first part of the fin, whereby a third structure is obtained;
- applying a third oxide to the third structure, whereby a fourth structure is obtained;
- polishing the fourth structure down to the second doped semiconductor material;
- recessing the third oxide such that the exposed part of the fin remains covered with the third oxide and the second doped semiconductor material and the covered part of the first doped semiconductor material protrude from the third oxide, whereby a fifth structure is obtained;
- covering a top of the fifth structure with a gate stack comprising a gate dielectric material and a gate electrode;
- applying a second resist over the contact region to form a first and a second gate;
- removing the gate stack that is not covered by the resist;
- removing the second resist, whereby a sixth structure is obtained;
- applying a fourth oxide to a top of the sixth structure; and
- polishing a top of the oxide down to the second doped semiconductor material, whereby a tunnel transistor according to claim 1 is obtained.

* * * * *